(12) United States Patent
Schricker

(10) Patent No.: US 8,530,318 B2
(45) Date of Patent: Sep. 10, 2013

(54) MEMORY CELL THAT EMPLOYS A SELECTIVELY FABRICATED CARBON NANO-TUBE REVERSIBLE RESISTANCE-SWITCHING ELEMENT FORMED OVER A BOTTOM CONDUCTOR AND METHODS OF FORMING THE SAME

(75) Inventor: April D. Schricker, Palo Alto, CA (US)

(73) Assignee: SanDisk 3D LLC, Milpitas, CA (US)

( * ) Notice: Subject to any disclaimer, the term of this patent is extended or adjusted under 35 U.S.C. 154(b) by 5 days.

(21) Appl. No.: 12/410,789

(22) Filed: Mar. 25, 2009

(65) Prior Publication Data

US 2009/0256131 A1    Oct. 15, 2009

Related U.S. Application Data

(60) Provisional application No. 61/044,414, filed on Apr. 11, 2008.

(51) Int. Cl.
   *H01L 21/8222* (2006.01)

(52) U.S. Cl.
   USPC .......................... 438/328; 365/148

(58) Field of Classification Search
   USPC .......................... 365/148; 438/328
   See application file for complete search history.

(56) References Cited

U.S. PATENT DOCUMENTS

| 5,854,102 | A | * | 12/1998 | Gonzalez et al. | 438/237 |
| 5,915,167 | A | | 6/1999 | Leedy | |
| 6,034,882 | A | | 3/2000 | Johnson et al. | |
| 6,706,402 | B2 | | 3/2004 | Rueckes et al. | |
| 6,858,481 | B2 | | 2/2005 | Krieger et al. | |
| 6,946,719 | B2 | | 9/2005 | Petti et al. | |
| 6,952,030 | B2 | | 10/2005 | Herner | |
| 7,038,935 | B2 | * | 5/2006 | Rinerson et al. | 365/148 |
| 7,149,108 | B2 | * | 12/2006 | Rinerson et al. | 365/163 |
| 7,176,064 | B2 | | 2/2007 | Herner | |
| 7,208,372 | B2 | | 4/2007 | Hsu et al. | |
| 7,286,388 | B1 | | 10/2007 | Chen et al. | |
| 7,385,266 | B2 | | 6/2008 | Segal et al. | |
| 7,405,465 | B2 | | 7/2008 | Herner | |

(Continued)

FOREIGN PATENT DOCUMENTS

| EP | 1 796 103 | 6/2007 |
| EP | 1 892 722 | 2/2008 |

(Continued)

OTHER PUBLICATIONS

Communication pursuant to Rules 161(1) and 162 EPC of European Patent Application No. 09739405.0 dtd Nov. 18, 2010.

(Continued)

*Primary Examiner* — Jarrett Stark
*Assistant Examiner* — Caleb Henry
(74) *Attorney, Agent, or Firm* — Dugan & Dugan, PC

(57) ABSTRACT

In some aspects, a method of fabricating a memory cell is provided that includes: (1) fabricating a first conductor above a substrate; (2) selectively fabricating a carbon nano-tube ("CNT") material above the first conductor by: (a) fabricating a CNT seeding layer on the first conductor, wherein the CNT seeding layer comprises silicon-germanium ("Si/Ge"), (b) planarizing a surface of the deposited CNT seeding layer, and (c) selectively fabricating CNT material on the CNT seeding layer; (3) fabricating a diode above the CNT material; and (4) fabricating a second conductor above the diode. Numerous other aspects are provided.

15 Claims, 16 Drawing Sheets

(56) References Cited

U.S. PATENT DOCUMENTS

| | | | |
|---|---|---|---|
| 7,575,984 B2* | 8/2009 | Radigan et al. | 438/467 |
| 7,638,383 B2* | 12/2009 | Jin et al. | 438/197 |
| 2004/0160812 A1* | 8/2004 | Rinerson et al. | 365/158 |
| 2004/0166235 A1* | 8/2004 | Fujii et al. | 427/77 |
| 2005/0064167 A1* | 3/2005 | Mao et al. | 428/292.1 |
| 2005/0195632 A1* | 9/2005 | Rinerson et al. | 365/148 |
| 2005/0213368 A1* | 9/2005 | Rinerson et al. | 365/148 |
| 2006/0214183 A1 | 9/2006 | Gaun et al. | |
| 2006/0250836 A1 | 11/2006 | Herner | |
| 2006/0268594 A1* | 11/2006 | Toda | 365/100 |
| 2006/0273298 A1* | 12/2006 | Petti | 257/5 |
| 2006/0276056 A1* | 12/2006 | Ward et al. | 438/800 |
| 2007/0018228 A1 | 1/2007 | Sandhu et al. | |
| 2007/0037414 A1 | 2/2007 | Yamauchi et al. | |
| 2007/0103963 A1 | 5/2007 | Kim et al. | |
| 2007/0132049 A1 | 6/2007 | Stipe | |
| 2007/0133266 A1 | 6/2007 | Furukawa et al. | |
| 2007/0158697 A1* | 7/2007 | Choi et al. | 257/246 |
| 2007/0190722 A1 | 8/2007 | Herner | |
| 2007/0238319 A1 | 10/2007 | Jewell-Larsen et al. | |
| 2008/0070162 A1* | 3/2008 | Ufert | 430/290 |
| 2008/0142776 A1* | 6/2008 | Seidl | 257/4 |
| 2008/0157257 A1* | 7/2008 | Bertin et al. | 257/476 |
| 2008/0165574 A1 | 7/2008 | Kim et al. | |
| 2008/0182408 A1* | 7/2008 | Lee et al. | 438/675 |
| 2008/0233744 A1 | 9/2008 | Kaul et al. | |
| 2009/0001343 A1 | 1/2009 | Schricker et al. | |
| 2009/0001345 A1 | 1/2009 | Schricker et al. | |
| 2009/0166609 A1 | 7/2009 | Schricker et al. | |
| 2009/0166610 A1* | 7/2009 | Schricker et al. | 257/40 |
| 2009/0168491 A1* | 7/2009 | Schricker et al. | 365/148 |
| 2009/0256130 A1 | 10/2009 | Schricker | |
| 2009/0256131 A1* | 10/2009 | Schricker | 257/4 |

FOREIGN PATENT DOCUMENTS

| | | |
|---|---|---|
| WO | WO 2006-061599 | 6/2006 |
| WO | WO 2006061599 A2 * | 6/2006 |
| WO | WO 2006/102391 A2 | 9/2006 |
| WO | WO 2006-122111 A2 | 11/2006 |
| WO | WO 2006-133949 | 12/2006 |
| WO | WO 2007/053180 | 5/2007 |
| WO | WO 2008-021900 | 2/2008 |
| WO | WO 2008/118486 | 10/2008 |

OTHER PUBLICATIONS

Dec. 22, 2010 Response to Nov. 18, 2010 Communication pursuant to Rules 161(1) and 162 EPC of related European Patent Application No. 09739405.0.

Abdi et al., "PECVD-Grown Carbon Nanotubes on Silicon Substrates with a Nickel-Seeded Tip-Growth Structure", Science Direct—Materials Science and Engineering C 26 (2006), pp. 1219-1223.

Choi et al., "Ultrahigh-density Nanotransistors by using Selectively Grown Vertical Carbon Nanotubes", Nov. 26, 2001, Applied Physics Letters, vol. 79, No. 22, pp. 3696-3698.

Herner et al., "Polysilicon Memory Switching: Electrothermal-Induced Order", Sep. 2006, IEEE Transactions on Electron Devices, vol. 53, No. 9, pp. 2320-2327.

Herner et al., "Vertical p-i-n Polysilicon Diode With Antifuse for Stackable Field-Programmable ROM", May 2004, IEEE Electron Device Letters, vol. 25, No. 5, pp. 271-273.

Li et al., "Bottom-up Approach for Carbon Nanotube Interconnects", Apr. 14, 2003, Applied Physics Letters, vol. 82, No. 15, pp. 2491-2493.

Malhi et al., "Characteristics and three-dimensional intergration of MOSFETs in small grain LPCVD polysilicon," IEEE J. Solid State Circuits, vol. SSC-20, pp. 178-201, Feb. 1985.

Meyyappan et al., "Carbon Nanotube Growth by PECVD: a Review", Plasma Sources Sci. Technol. 12 (2003), pp. 205-216.

Nozaki et al., "Fabrication of Vertically Aligned Single-Walled Carbon Nanotubes in Atmospheric Pressure Non-Thermal Plasma CVD", 2006, Science Direct—Carbon 45 (2007), pp. 364-374.

Rao et al., "In Situ-Grown Carbon Nanotube Array with Excellent Field Emission Characteristics", Jun. 19, 2000, Applied Physics Letters, vol. 76, No. 25, pp. 3813-3815.

Shin et al., "Influence of Morphology of Catalyst Thin Film on Vertically Aligned Carbon Nanotube Growth", Science Direct—Journal of Crystal Growth 271 (2004), pp. 81-89.

Smith et al., "Polishing TiN for Nanotube Synthesis", Nov. 2001, Proceedings of the 16th Annual Meeting of the American Society for Precision Engineering, pp. 1-4.

Son et al., "Electrical Switching in Metallic Carbon Nanotubes", Physical Review Letters, vol. 95, Issue 21, ID 216602, 2005.

Srivastava et al., "Carbon Nanotube Interconnects: Implications for Performance, Power Dissipation and Thermal Management", 2005, IEEE, pp. 1-4.

Uchino et al., "Catalyst Free Low Temperature Direct Growth of Carbon Nanotubes", Jul. 2005, Proceedings of 2005 5th IEEE Conference on Nanotechnology, pp. 1-4.

Subramanian et al., "High-Performance Germanium-Seeded Laterally Crystallized TFTs for Vertical Device Integration," Electron Devices, IEEE Transactions; Publication Date: Sep. 1998, vol. 45, Issue 9, pp. 1934-1939.

International Search Report and Written Opinion of International Application No. PCT/US2009/040131 mailed Jun. 29, 2010.

International Search Report and Written Opinion of International Application No. PCT/US2009/040189 mailed Jul. 16, 2009.

Restriction Requirement of U.S. Appl. No. 12/410,771 mailed Jun. 24, 2010.

Jun. 29, 2010 Reply to Restriction Requirement of U.S. Appl. No. 12/410,771 mailed Jun. 24, 2010.

Office Action of U.S. Appl. No. 12/410,771 mailed Oct. 8, 2010.

Jan. 6, 2011 Reply to Office Action of U.S. Appl. No. 12/410,771 mailed Oct. 8, 2010.

Communication pursuant to Rules 161(1) and 162 PCT of European Patent Application No. 09730256.6 dated Nov. 22, 2010.

Dec. 21, 2010 Reply to Nov. 22, 2010 Communication pursuant to Rules 161(1) and 162 PCT of European Patent Application No. 09730256.6.

Final Office Action of related U.S. Appl. No. 12/410,771 dated Jan. 21, 2011.

Mar. 21, 2011 Reply to Jan. 21, 2011 Final Office Action of related U.S. Appl. No. 12/410,771.

Mar. 21, 2011 Terminal Disclaimer filed in related U.S. Appl. No. 12/410,771.

Notice of Allowance of related U.S. Appl. No. 12/410,771 mailed Apr. 5, 2011.

Notice of Allowance of related U.S. Appl. No. 12/410,771 mailed May 6, 2011.

Ago et al., "Workfunction of Purified and Oxidised Carbon Nanotubes," Synthetic Metals, vol. 103, pp. 2494-2495 (1999).

Notice of Allowance of related U.S. Appl. No. 12/410,771 mailed Oct. 28, 2011.

Jang, J.E. et al. "Nanoelectromechanical switches with vertically aligned carbon nanotubes", Applied Physics Letters, vol. 87, (2005) pp. 163114-1-163114-3.

Schricker et al., U.S. Appl. No. 13/235,409, filed Sep. 18, 2011.

Sep. 18, 2012 Response to May 3, 2012 Office Action of related Chinese Patent Application Serial No. 200980120069.5.

Notice of Allowance of related U.S. Appl. No. 12/410,771 mailed Jul. 17, 2012.

Office Action of related Chinese Patent Application Serial No. 200980120069.5 dated May 3, 2012.

Sep. 7, 2012 Response to May 4, 2012 Office Action of related Chinese Patent Application Serial No. 200980122196.9.

Second Office Action of related Chinese Patent Application Serial No. 200980120069.5 dated Nov. 8, 2012.

Jan. 17, 2013 Response to Nov. 8, 2012 Second Office Action of related Chinese Patent Application Serial No. 200980120069.5.

Office Action of related Chinese Patent Application Serial No. 200980122196.9 dated May 4, 2012.

* cited by examiner

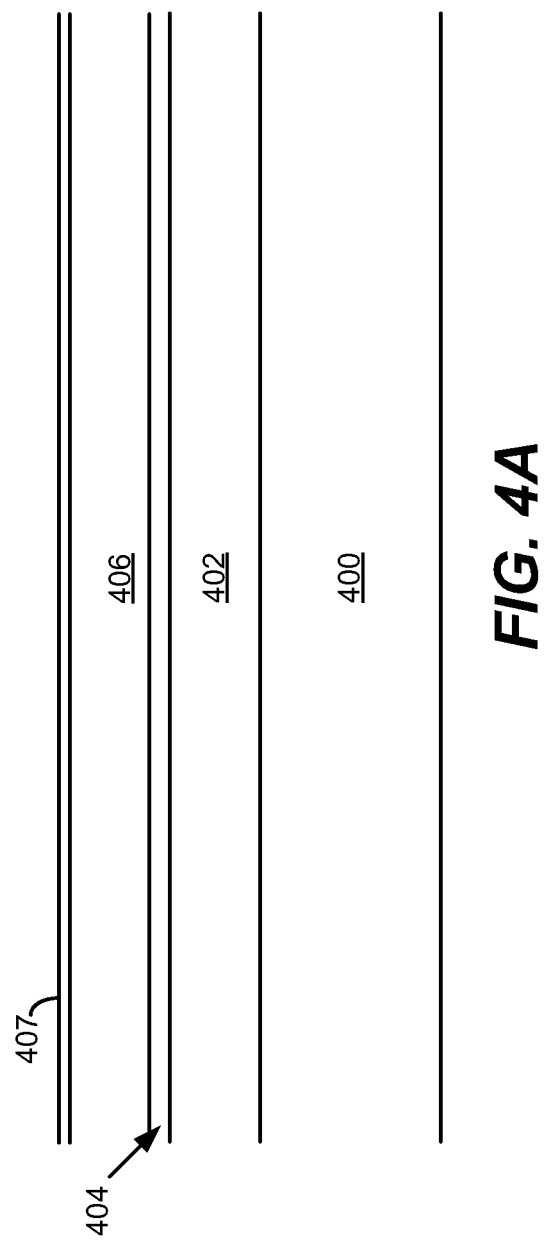

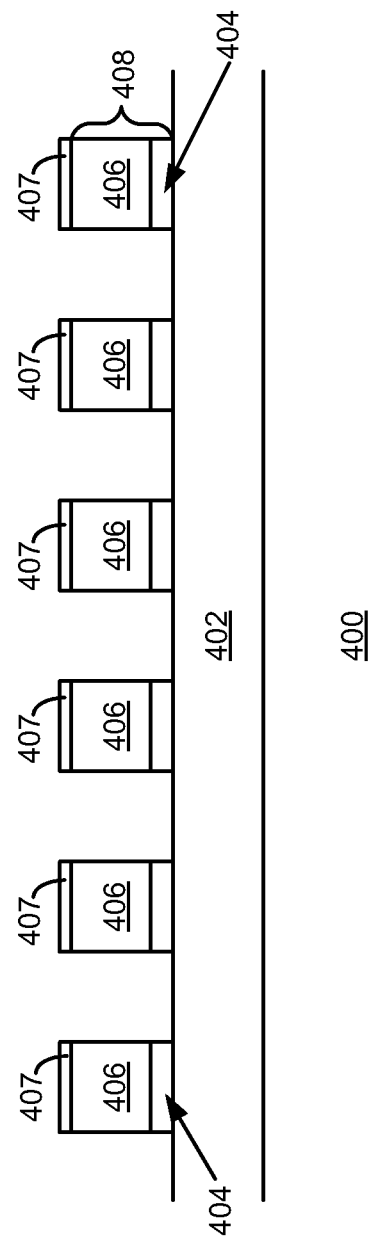

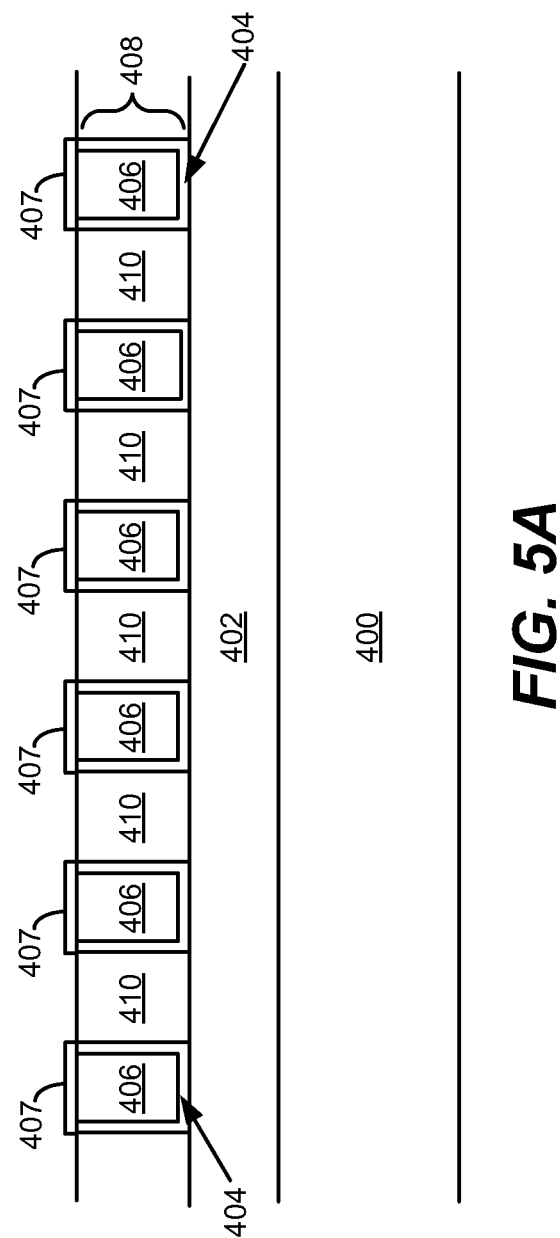

MEMORY CELL THAT EMPLOYS A SELECTIVELY FABRICATED CARBON NANO-TUBE REVERSIBLE RESISTANCE-SWITCHING ELEMENT FORMED OVER A BOTTOM CONDUCTOR AND METHODS OF FORMING THE SAME

REFERENCE TO RELATED APPLICATIONS

This application claims the benefit of U.S. Provisional Patent Application No. 61/044,414, filed Apr. 11, 2008, which is incorporated by reference herein in its entirety for all purposes.

This application is related to the following patent applications, each of which is hereby incorporated by reference herein in its entirety for all purposes: (1) U.S. patent application Ser. No. 12/410,771, filed Mar. 25, 2009 and titled "Memory Cell That Employs A Selectively Fabricated Carbon Nano-Tube Reversible Resistance Switching Element, And Methods Of Forming The Same;" (2) U.S. patent application Ser. No. 11/968,156, filed Dec. 31, 2007 and titled "Memory Cell That Employs A Selectively Fabricated Carbon Nano-Tube Reversible Resistance-Switching Element Formed On A Bottom Conductor And Methods Of Forming The Same;" (3) U.S. patent application Ser. No. 11/968,159, filed Dec. 31, 2007 and titled "Memory Cell With Planarized Carbon Nanotube Layer And Methods Of Forming The Same;" (4) U.S. patent application Ser. No. 11/968,154, filed Dec. 31, 2007 and titled "Memory Cell That Employs A Selectively Fabricated Carbon Nano-Tube Reversible Resistance-Switching Element And Methods Of Forming The Same;" and (5) U.S. Provisional Patent Application Ser. No. 61/044,406, filed Apr. 11, 2008 and titled "Memory Cell That Employs A Selectively Fabricated Carbon Nano-Tube Reversible Resistance-Switching Element And Methods Of Forming The Same."

BACKGROUND

Non-volatile memories formed from reversible resistance-switching elements are known. For example, U.S. patent application Ser. No. 11/968,154, filed Dec. 31, 2007, titled "Memory Cell That Employs A Selectively Fabricated Carbon Nano-Tube Reversible Resistance Switching Element And Methods Of Forming The Same" (the "'154 Application"), which is hereby incorporated by reference herein in its entirety for all purposes, describes a rewriteable non-volatile memory cell that includes a diode coupled in series with a carbon-based reversible resistivity switching material such as carbon.

However, fabricating memory devices from rewriteable resistivity-switching materials is technically challenging. Improved methods of forming memory devices that employ resistivity-switching materials are desirable.

SUMMARY

In a first aspect of the invention, a method of fabricating a memory cell is provided that includes: (1) fabricating a first conductor above a substrate; (2) selectively fabricating a carbon nano-tube ("CNT") material above the first conductor by: (a) fabricating a CNT seeding layer on the first conductor, wherein the CNT seeding layer comprises silicon-germanium ("Si/Ge"), (b) planarizing a surface of the deposited CNT seeding layer, and (c) selectively fabricating CNT material on the CNT seeding layer; (3) fabricating a diode above the CNT material; and (4) fabricating a second conductor above the diode.

In a second aspect of the invention, a method of fabricating a memory cell is provided that includes: (1) fabricating a first conductor above a substrate; (2) fabricating a reversible resistance-switching element above the first conductor by selectively fabricating CNT material above the first conductor by: (a) fabricating a CNT seeding layer on the first conductor, wherein the CNT seeding layer comprises Si/Ge, (b) planarizing a surface of the deposited CNT seeding layer, and (c) selectively fabricating CNT material on the CNT seeding layer; (3) fabricating a vertical polycrystalline diode above the reversible resistance-switching element; and (4) fabricating a second conductor above the vertical polycrystalline diode.

In a third aspect of the invention, a memory cell is provided that includes: (1) a first conductor; (2) a patterned and etched CNT seeding layer comprising Si/Ge; (3) a reversible resistance-switching element including CNT material selectively fabricated on the CNT seeding layer; (4) a diode formed above the reversible resistance-switching element; and (5) a second conductor formed above the diode.

In a fourth aspect of the invention, a plurality of nonvolatile memory cells are provided that include: (1) a first plurality of substantially parallel, substantially coplanar conductors extending in a first direction; (2) a plurality of diodes; (3) a plurality of reversible resistance-switching elements, each reversible resistance-switching element comprising: (a) a patterned and etched CNT seeding layer comprising Si/Ge fabricated above one of first conductors, and (b) a CNT material layer selectively fabricated on the CNT seeding layer; and (4) a second plurality of substantially parallel, substantially coplanar conductors extending in a second direction different from the first direction, wherein, in each memory cell, one of the diodes is formed above one of the reversible resistance-switching elements, disposed between one of the first conductors and one of the second conductors.

In a fifth aspect of the invention, a monolithic three dimensional memory array is provided that includes: (1) a first memory level formed above a substrate, the first memory level comprising a plurality of memory cells, wherein each memory cell of the first memory level comprises: (a) a first conductor; (b) a reversible resistance-switching element including a patterned and etched carbon nano-tube ("CNT") seeding layer comprising silicon-germanium fabricated above the first conductor, and a CNT material layer selectively fabricated on the CNT seeding layer; (c) a diode formed above the reversible resistance-switching element; and (d) a second conductor formed above the diode; and (2) at least a second memory level monolithically formed above the first memory level. Numerous other aspects are provided in accordance with these and other embodiments of the invention.

Other features and aspects of the present invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which:

FIGS. 4A-G illustrate cross sectional views of a portion of a substrate during fabrication of a first exemplary memory level in accordance with the present invention; and FIGS. 5A-C illustrate cross sectional views of a portion of a substrate during fabrication of a second exemplary memory level provided in accordance with the present invention.

DETAILED DESCRIPTION

Figure 1:
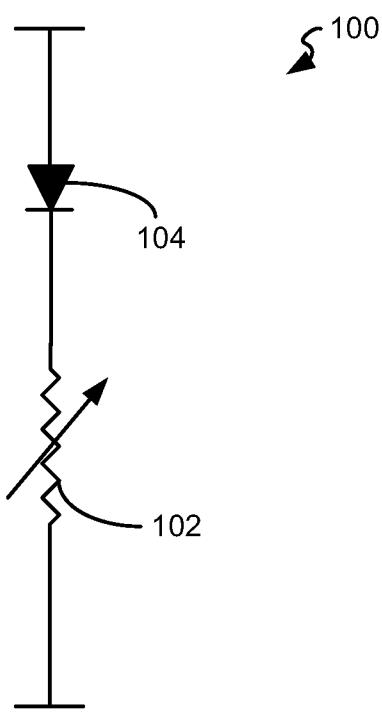
FIG. 1 is a schematic illustration of an exemplary memory cell provided in accordance with the present invention.

Some CNT materials have been shown to exhibit reversible resistivity-switching properties that may be suitable for use in non-volatile memories. However, deposited or grown CNT material typically has a rough surface topography, with pronounced thickness variations, such as numerous peaks and valleys. These thickness variations make CNT materials difficult to etch without excessive etching of the underlying substrate, increasing fabrication costs and complexity associated with their use in integrated circuits.

In accordance with the present invention, difficult-to-etch, CNT rewriteable resistivity-switching materials may be used within a memory cell without being etched. For example, in at least one embodiment, a memory cell is provided that includes a CNT reversible resistivity-switching material formed by (1) fabricating a first conductor above a substrate; (2) depositing a CNT seeding layer above the first conductor; (3) selectively fabricating CNT material on the CNT seeding layer; (4) fabricating a diode above the CNT material; and (5) fabricating a second conductor above the diode. The CNT seeding layer may be a layer that facilitates CNT formation, such as (1) a single layer of roughened metal nitride, such as surface roughened titanium or tantalum nitride, (2) a multilayer structure formed from a smooth or surface roughened metal nitride coated with a metal catalyst, (3) a single layer of a metal catalyst such as nickel, cobalt, iron, etc., or (4) a non-metal Si/Ge seed layer. Selective formation of CNT material on the CNT seeding layer can eliminate or minimize the need to etch the CNT material.

Exemplary CNT seeding layers include titanium nitride, tantalum nitride, nickel, cobalt, iron or the like, or a non-metal Si/Ge seed layer. In some embodiments, a titanium or tantalum nitride layer may be surface roughened for use as a CNT seeding layer. Such surface roughened titanium or tantalum nitride may itself serve as a CNT seeding layer. In other embodiments, the surface roughened titanium or tantalum nitride layer may be coated with an additional conducting layer to facilitate CNT material formation. Such a conducting layer may be patterned and etched with the titanium or tantalum nitride layer, or selectively deposited on the titanium or tantalum nitride layer after the titanium or tantalum nitride layer is patterned and etched. Exemplary conducting layers include nickel, cobalt, iron, etc.

As used herein, CNT material refers to material that includes one or more single and/or multi-wall CNTs. In some embodiments, the individual tubes of the CNT material may be vertically aligned. Vertically aligned CNTs allow vertical current flow with little or no lateral conduction. In some embodiments, the individual tubes of the CNT material may be fabricated so as to be substantially vertically aligned to reduce or prevent the formation of lateral or bridging conduction paths between adjacent memory cells. This vertical alignment reduces and/or prevents the state of a memory cell from being influenced or "disturbed" by the state and/or programming of adjacent memory cells. Note that individual tube isolation may or may not extend over the entire thickness of the CNT material. For example, during the initial growth phase, some or most of the individual tubes may be vertically aligned and separated. However, as the individual tubes increase in length vertically, portions of the tubes may come in contact with one another, and even become entangled or entwined. Exemplary techniques for forming CNT materials are described below.

Exemplary Inventive Memory Cell

FIG. 1 is a schematic illustration of an exemplary memory cell 100 provided in accordance with this invention. Memory cell 100 includes a reversible resistance-switching element 102 coupled to a diode 104 and positioned below diode 104.

Reversible resistance-switching element 102 includes material (not separately shown) having a resistivity that may be reversibly switched between two or more states. For example, the reversible resistivity-switching material of element 102 may be in an initial, low-resistivity state upon fabrication. Upon application of a first voltage and/or current, the material is switchable to a high-resistivity state. Application of a second voltage and/or current may return the reversible resistivity-switching material to a low-resistivity state. Alternatively, reversible resistance-switching element 102 may be in an initial, high-resistance state upon fabrication that is reversibly switchable to a low-resistance state upon application of the appropriate voltage(s) and/or current(s).

When used in a memory cell, one resistance state may represent a binary "0," and another resistance state may represent a binary "1", although more than two data/resistance states may be used. Numerous reversible resistivity-switching materials and operation of memory cells employing reversible resistance-switching elements are described, for example, in U.S. patent application Ser. No. 11/125,939, filed May 9, 2005 and titled "Rewriteable Memory Cell Comprising A Diode And A Resistance-Switching Material," which is hereby incorporated by reference herein in its entirety for all purposes.

In at least one embodiment of the invention, reversible resistance-switching element 102 is formed using a selectively deposited or grown CNT material. As will be described further below, use of a selectively formed CNT material eliminates the need to etch the CNT material. Fabrication of reversible resistance-switching element 102 thereby is simplified.

Diode 104 may include any diode that exhibits non-ohmic conduction by selectively limiting the voltage across and/or the current flow through reversible resistance-switching element 102. In this manner, memory cell 100 may be used as part of a two or three dimensional memory array and data may be written to and/or read from the memory cell 100 without affecting the state of other memory cells in the array.

Exemplary embodiments of memory cell 100, reversible resistance-switching element 102 and diode 104 are described below with reference to FIGS. 2A-5C.

First Exemplary Embodiment of a Memory Cell

Figure 2A:
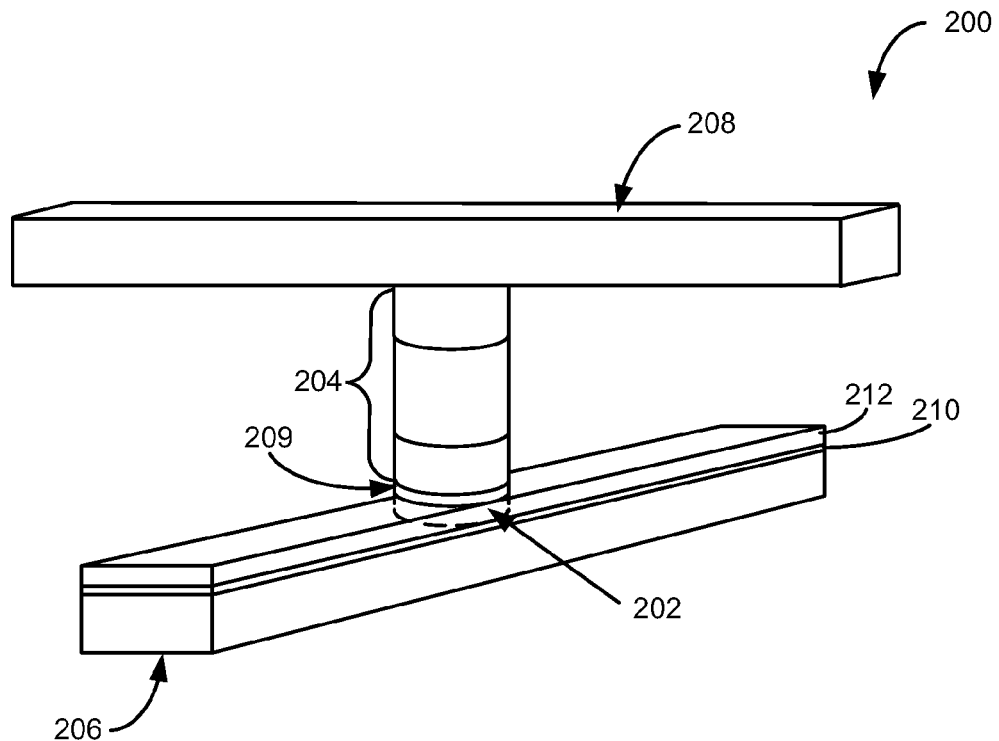
FIG. 2A is a simplified perspective view of a first embodiment of a memory cell provided in accordance with the present invention.

FIG. 2A is a simplified perspective view of a first embodiment of a memory cell 200 provided in accordance with the present invention. With reference to FIG. 2A, memory cell 200 includes a reversible resistance-switching element 202 (shown in phantom) coupled in series with a diode 204 between a first conductor 206 and a second conductor 208. In some embodiments, a barrier layer 209 such as titanium nitride, tantalum nitride, tungsten nitride, etc., may be provided between reversible resistance-switching element 202 and diode 204.

As will be described further below, reversible resistance-switching element 202 is selectively formed to simplify fabrication of memory cell 200. In at least one embodiment, reversible resistance-switching element 202 includes at least a portion of a CNT material formed on a CNT seeding layer such as titanium nitride, tantalum nitride, nickel, cobalt, iron or the like. For example, a titanium or tantalum nitride CNT seeding layer 210 may be deposited on first conductor 206, patterned and etched (e.g., with first conductor 206). In some embodiments CNT seeding layer 210 may be surface roughened, such as by chemical mechanical polishing ("CMP"). In other embodiments, a surface roughened or smooth titanium nitride, tantalum nitride or similar layer may be coated with a metal catalyst layer (not separately shown) such as nickel, cobalt, iron, etc., to form CNT seeding layer 210. In still other embodiments, CNT seeding layer 210 may simply be a metal catalyst layer such as nickel, cobalt, iron or the like that promotes CNT formation. In still other embodiments, CNT seeding layer 210 may be a non-metal Si/Ge layer that promotes CNT formation.

In all cases, a CNT fabrication process is performed to selectively grow and/or deposit CNT material 212 over CNT seeding layer 210. At least a portion of CNT material 212 serves as reversible resistance-switching element 202. Any suitable method may be used to form CNT material 212 such as chemical vapor deposition ("CVD"), plasma-enhanced CVD ("PECVD"), laser vaporization, electric arc discharge or the like.

In the embodiment of FIG. 2A, a titanium nitride or similar CNT seeding layer 210 is formed over first conductor 206 and the exposed upper surface of CNT seeding layer 210 is roughened by CMP or another similar process. CNT seeding layer 210 then is patterned and etched with the first conductor 206. Thereafter, CNT material 212 is selectively formed over the CNT seeding layer 210. A portion of CNT material 212 that vertically overlaps and/or aligns with diode 204 may serve as reversible resistance-switching element 202 between diode 204 and first conductor 206 of the memory cell 200. In some embodiments, only a portion, such as one or more CNTs, of reversible resistance-switching element 202 may switch and/or be switchable. Additional details for reversible resistance-switching element 202 are described below with reference to FIGS. 3A-C.

Diode 204 may include any suitable diode such as a vertical polycrystalline p-n or p-i-n diode, whether upward pointing with an n-region above a p-region of the diode or downward pointing with a p-region above an n-region of the diode. Exemplary embodiments of diode 204 are described below with reference to FIG. 3A.

First and/or second conductor 206, 208 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 206, 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with first and/or second conductors 206, 208 to improve device performance and/or aid in device fabrication.

Figure 2B:
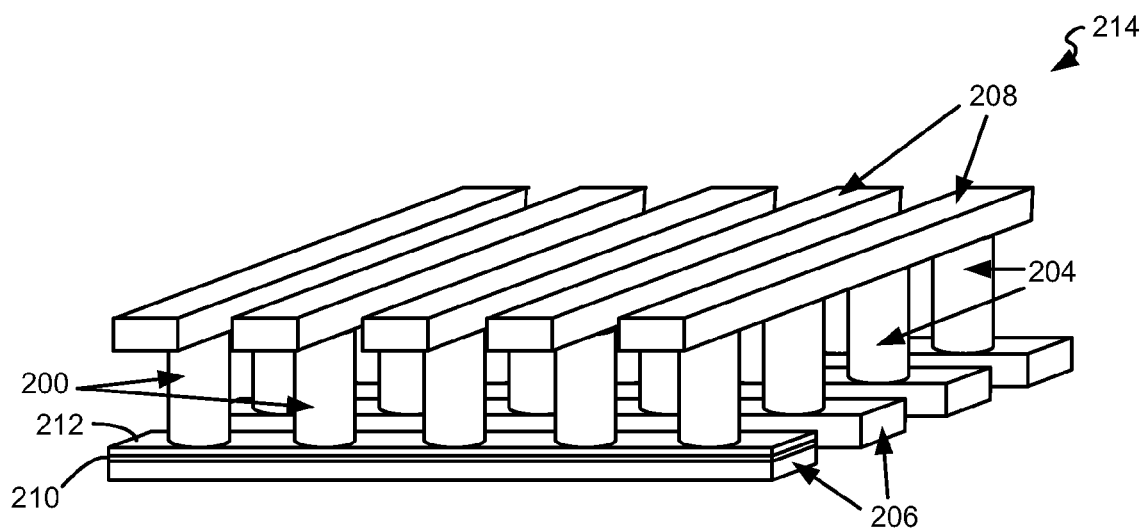
FIG. 2B is a simplified perspective view of a portion of a first memory level formed from a plurality of the memory cells of FIG. 2A.

FIG. 2B is a simplified perspective view of a portion of a first memory level 214 formed from a plurality of memory cells 200 of FIG. 2A. For simplicity, CNT seeding layer 210 and CNT material 212 are only shown on one of first conductors 206. Memory array 214 is a "cross-point" array including a plurality of bit lines (second conductors 208) and word lines (first conductors 206) to which multiple memory cells are coupled (as shown). Other memory array configurations may be used, as may multiple levels of memory. Because multiple memory cells are coupled to CNT material 212 formed on each conductor 206, in one or more embodiments, the individual tubes of CNT material 212 are preferably substantially vertically aligned to reduce lateral conduction or bridging between memory cells through CNT material 212. Note that individual tube isolation may or may not extend over the entire thickness of the CNT material. For example, during the initial growth phase, some or most of the individual tubes may be vertically aligned and separated. However, as the individual tubes increase in length vertically, portions of the tubes may come in contact with one another, and even become entangled or entwined.

Figure 2C:
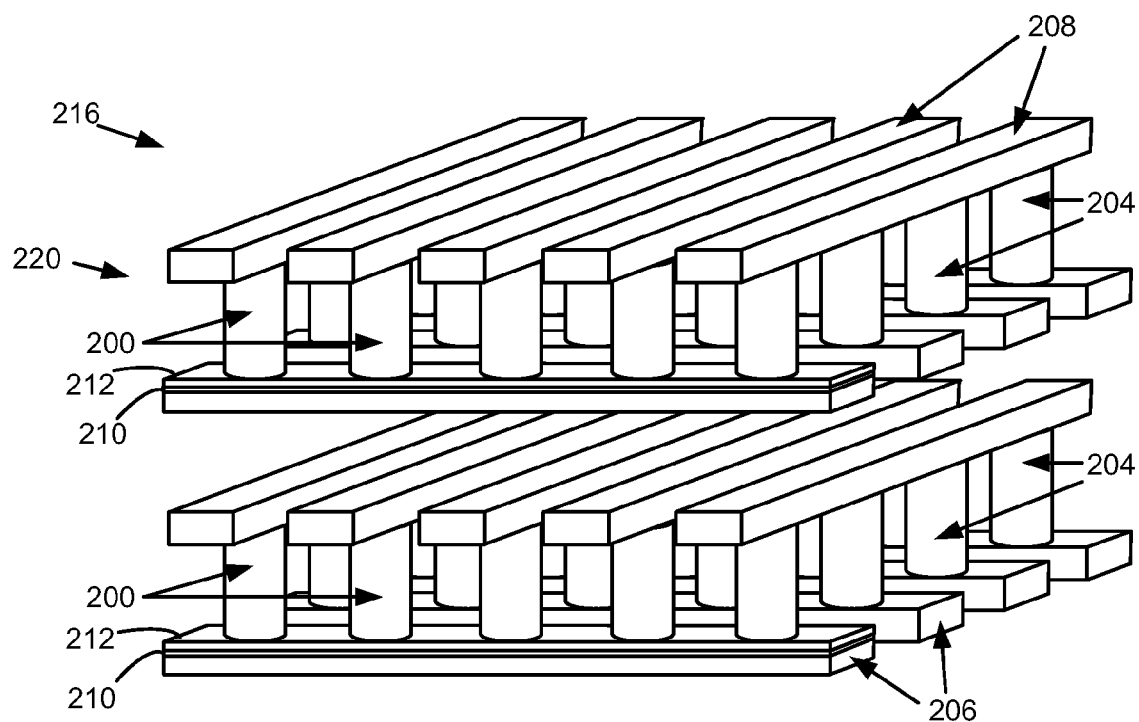
FIG. 2C is a simplified perspective view of a portion of a first exemplary three dimensional memory array provided in accordance with the present invention.

FIG. 2C is a simplified perspective view of a portion of a monolithic three dimensional array 216 that includes a first memory level 218 positioned below a second memory level 220. In the embodiment of FIG. 2C, each memory level 218, 220 includes a plurality of memory cells 200 in a cross-point array. It will be understood that one or more additional layers (e.g., an interlevel dielectric) may be present between first and second memory levels 218 and 220, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diodes fabrication.

Figure 2D:
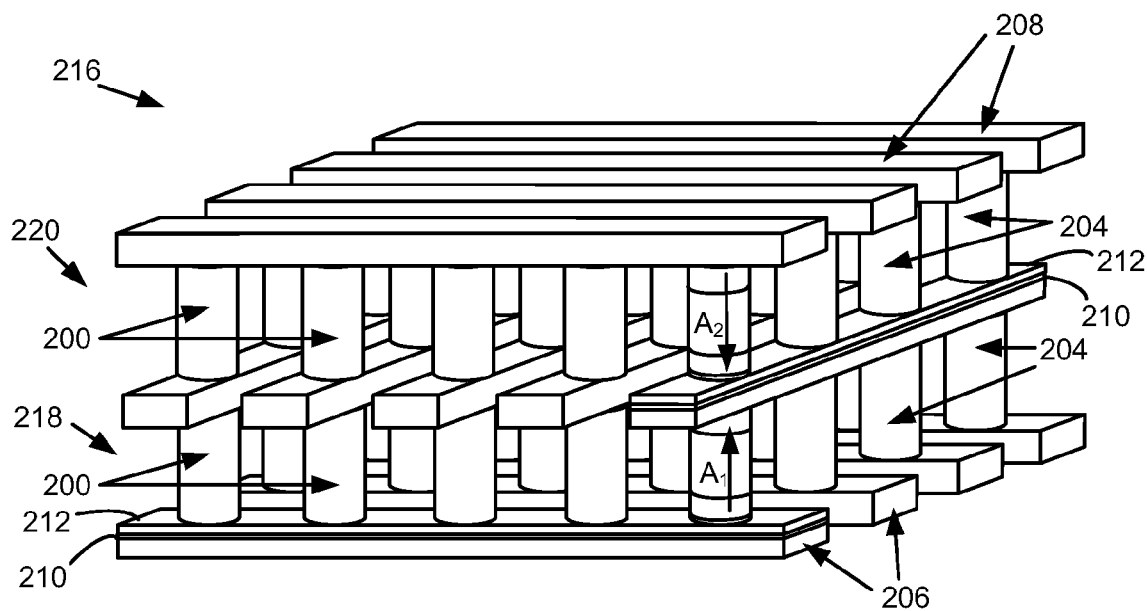
FIG. 2D is a simplified perspective view of a portion of a second exemplary three dimensional memory array provided in accordance with the present invention.

In some embodiments, the memory levels may be formed, as described, for example, in U.S. Pat. No. 6,952,030, "High-density three-dimensional memory cell" which is hereby incorporated by reference herein in its entirety for all purposes. For instance, the upper conductors of a first memory level may be used as the lower conductors of a second memory level that is positioned above the first memory level as shown in FIG. 2D. In such embodiments, the diodes on adjacent memory levels preferably point in opposite directions as described in U.S. patent application Ser. No. 11/692,151, filed Mar. 27, 2007 and titled "Large Array Of Upward Pointing P-I-N Diodes Having Large And Uniform Current" (the "'151 Application"), which is hereby incorporated by reference herein in its entirety for all purposes. For example, the diodes of first memory level 218 may be upward pointing diodes as indicated by arrow $A_1$ (e.g., with p regions at the bottom of the diodes), whereas the diodes of second memory level 220 may be downward pointing diodes as indicated by arrow $A_2$ (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

Figure 3A:
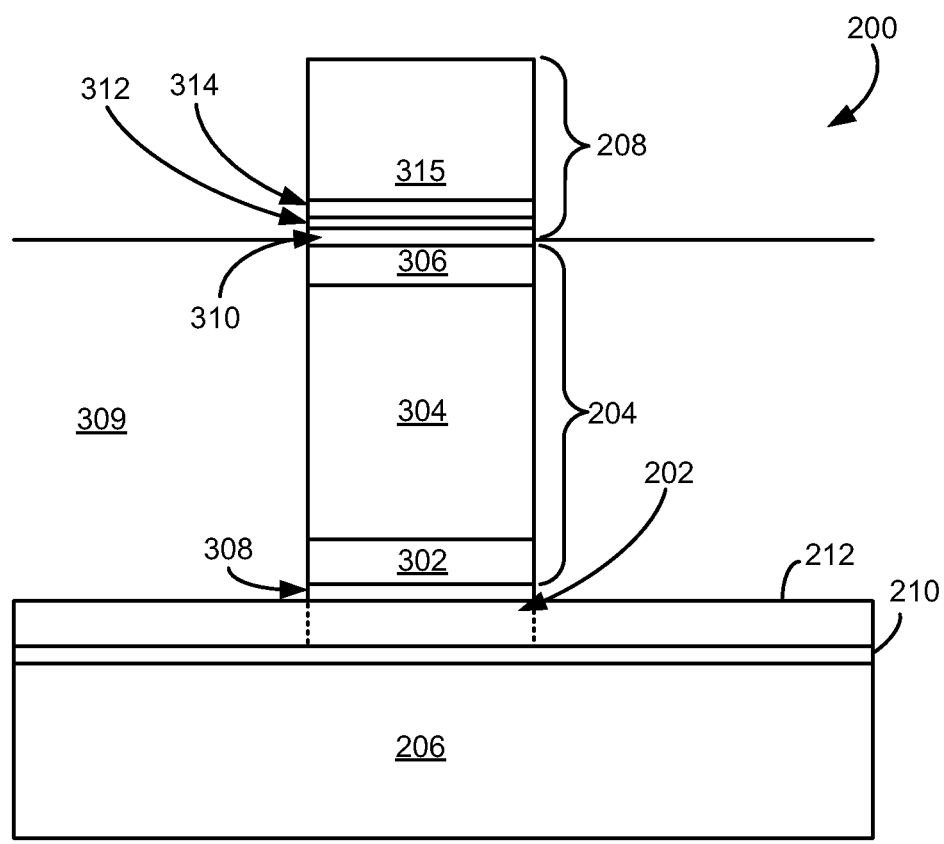
FIG. 3A is a cross-sectional view of a first exemplary embodiment of the memory cell of FIG. 2A.

FIG. 3A is a cross-sectional view of an exemplary embodiment of memory cell 200 of FIG. 2A. With reference to FIG. 3A, memory cell 200 includes reversible resistance-switching element 202, diode 204 and first and second conductors 206, 208. Reversible resistance-switching element 202 may be a portion of CNT material 212 that vertically overlies and/or overlaps with diode 204.

In the embodiment of FIG. 3A, reversible resistance-switching element 202 is formed by a selective CNT formation process on a CNT seeding layer 210 formed over first conductor 206. In some embodiments, CNT seeding layer 210 may be (1) a single layer of roughened metal nitride, such as surface roughened titanium or tantalum nitride, (2) a multi-layer structure formed from a smooth or surface roughened metal nitride coated with a metal catalyst, (3) a single layer of a metal catalyst such as nickel, cobalt, iron, etc., or (4) a non-metal Si/Ge seed layer. For example, CNT seeding layer 210 may be a Si/Ge layer formed on and patterned and etched with first conductor 206. Using a non-metal Si/Ge seed has the advantage that silicon and germanium materials are compatible with conventional semiconductor fabrication facility materials, unlike iron-based metal CNT seed materials.

In other embodiments, CNT seeding layer 210 may be formed after first conductor 206 is patterned and etched. For example, CNT seeding layer 210 may be a metal catalyst layer such as nickel, cobalt, iron, etc., selectively deposited on the patterned and etched first conductor 206. In either case, CNT material 212 is selectively formed only over the CNT seeding layer 210. In this manner, at most, only CNT seeding layer 210 is etched, such as during the pattern and etch step(s) for the first conductor 206.

In embodiments in which CNT seeding layer 210 includes titanium nitride, tantalum nitride or a similar material, a CMP or dielectric etchback step may be employed to roughen the surface of CNT seeding layer 210 prior to patterning and etching of CNT seeding layer 210 (and first conductor 206). A roughened, titanium nitride, tantalum nitride or similar surface may be employed as a seeding layer for CNT fabrication. For example, roughened titanium nitride has been shown to facilitate formation of vertically aligned CNTs as described by Smith et al., "Polishing TiN for Nanotube Synthesis", Proceedings of the 16th Annual Meeting of the American Society for Precision Engineering, Nov. 10-15, 2001 (the "Smith Article"). See also Rao et al., "In Situ-Grown Carbon Nanotube Array With Excellent Field Emission Characteristics", Appl. Phys. Letters, 76:25, 19 Jun. 2000, pp. 3813-3815 (the "Rao Article"))

As an example, CNT seeding layer 210 may be about 1000 to about 5000 angstroms of a metal nitride such as titanium or tantalum nitride with an arithmetic average surface roughness Ra of about 850 to about 4000 angstroms, and more preferably about 4000 angstroms. In some embodiments, about 1 to about 200 angstroms, and more preferably about 20 angstroms or less, of a metal catalyst layer such as nickel, cobalt, iron, etc., may be deposited onto the surface roughened metal nitride layer prior to CNT formation. In yet other embodiments, CNT seeding layer 210 may include about 20 to about 500 angstroms of non-roughened or smooth titanium, tantalum or similar metal nitride coated with about 1 to about 200 angstroms, and more preferably about 20 angstroms or less, of a metal catalyst layer such as nickel, cobalt, iron, etc. The nickel, cobalt, iron or other metal catalyst layer in any embodiment may be a continuous or non-continuous film. In still other embodiments, CNT seeding layer 314 may include about 1 to about 500 angstroms, and more preferably about 5 angstroms to about 19 angstroms of Si/Ge material. Other materials, thicknesses and surface roughnesses may be used.

In some embodiments, the metal catalyst layer may be formed using an arc plasma gun ("APG") method in which an arc plasma gun pulses a lightning bolt onto a metal target to shower a substrate with small metal particles (e.g., about 3 nanometers in size). An APG method may provide a very controllable seed density (e.g., as the substrate is not generally heated during deposition and the small metal particles have little mobility).

Other materials, thicknesses and surface roughnesses may be used. Following formation of CNT seeding layer 210, CNT seeding layer 210 and/or first conductor 206 may be patterned and etched.

After the CNT seeding layer 210 is defined, a CNT fabrication process is performed to selectively grow and/or deposit CNT material 212 on the CNT seeding layer 210. At least a portion of this CNT material 212 serves as the reversible resistance-switching element 202 (as shown in phantom in FIG. 3A). Any suitable method may be used to form CNT material on CNT seeding layer 210. For example, CVD, plasma-enhanced CVD, laser vaporization, electric arc discharge or the like may be employed.

In one exemplary embodiment, CNTs may be formed on a TiN seeding layer by CVD at a temperature of about 675 to 700° C. in xylene, argon, hydrogen and/or ferrocene at a flow rate of about 100 sccm for about 30 minutes. Other temperatures, gases, flow rates and/or growth times may be used.

In another exemplary embodiment, CNTs may be formed on a nickel catalyst layer by CVD at a temperature of about 650° C. in about 20% $C_2H_4$ and 80% argon at a pressure of about 5.5 Torr for about 20 minutes. Other temperatures, gases, ratios, pressures and/or growth times may be used.

In yet another embodiment, CNTs may be formed on a metal catalyst layer such as nickel, cobalt, iron, etc., using plasma enhanced CVD at a temperature of about 600 to 900° C. in about 20% methane, ethylene, acetylene or another hydrocarbon diluted with about 80% argon, hydrogen and/or ammonia using an RF power of about 100-200 Watts for about 8-30 minutes. Other temperatures, gases, ratios, powers and/or growth times may be used.

In still another embodiment, CNTs may be formed on a Si/Ge seeding layer using CVD or PECVD. To grow CNTs using the carbon implanted Si/Ge seeds, a CVD technique may be used at a temperature of about 850° C. for approximately 10 minutes using methane diluted with $H_2$ gas. Other carbon precursors might be used to form CNTs as well.

As stated, CNT material 212 forms only over CNT seeding layer 210. In some embodiments, CNT material 212 may have a thickness of about 1 nanometer to about 1 micron (and even tens of microns), and more preferably about 10 to about 20 nanometers, although other CNT material thicknesses may be used. The density of individual tubes in CNT material 212 may be, for example, about $6.6\times10^3$ to about $1\times10^6$ CNTs/micron$^2$, and more preferably at least about $6.6\times10^4$ CNTs/micron$^2$, although other densities may be used. For example, assuming diode 204 has a width of about 45 nanometers, in some embodiments, it is preferred to have at least about 10 CNTs, and more preferably at least about 100 CNTs, under diode 204 (although fewer CNTs, such as 1, 2, 3, 4, 5, etc., or more CNTs, such as more than 100, may be employed).

To improve the reversible resistivity-switching characteristics of CNT material 212, in some embodiments it may be preferable that at least about 50%, and more preferably at least about ⅔, of the carbon nano-tubes of CNT material 212 are semiconducting. Multiple wall CNTs are generally metallic, whereas single wall CNTs may be metallic or semiconducting. In one or more embodiments, it may be preferable for CNT material 212 to include primarily semiconducting single wall CNTs. In other embodiments, fewer than 50% of the CNTs of the CNT material 212 may be semiconducting.

Vertically aligned CNTs allow vertical current flow with little or no lateral conduction. To reduce or prevent the formation of lateral or bridging conduction paths between adjacent memory cells (not shown) fabricated on a memory level that includes the memory cell 200, in some embodiments, the individual tubes of CNT material 212 may be fabricated to be substantially vertically aligned (e.g., thereby reducing and/or preventing the state of a memory cell from being influenced or "disturbed" by the state and/or programming of adjacent memory cells). Note that individual tube isolation may or may not extend over the entire thickness of CNT material 212. For example, during the initial growth phase, some or most of the individual tubes may be vertical aligned (e.g., not touching). However, as the individual tubes increase in length vertically, portions of the tubes may come in contact with one another, and even become entangled or entwined.

In some embodiments, defects may be intentionally created in CNT material 212 to improve or otherwise tune the reversible resistivity-switching characteristics of CNT material 212. For example, after CNT material 212 has been formed on CNT seeding layer 210, argon, $O_2$ or another species may be implanted into CNT material 212 to create defects in CNT material 212. In a second example, CNT material 212 may be subjected or exposed to an argon or $O_2$ plasma (biased or chemical) to intentionally create defects in CNT material 212.

In some embodiments in accordance with this invention, following formation of CNT material 212, an anneal step may be performed prior to depositing dielectric material. In particular, the anneal may be performed in a vacuum or the presence of one or more forming gases, at a temperature in the range from about 350° C. to about 900° C., for about 30 to about 180 minutes. The anneal preferably is performed in about an 80%($N_2$):20%($H_2$) mixture of forming gases, at about 625° C. for about one hour.

Suitable forming gases may include one or more of $N_2$, Ar, and $H_2$, whereas preferred forming gases may include a mixture having above about 75% $N_2$ or Ar and below about 25% $H_2$. Alternatively, a vacuum may be used. Suitable temperatures may range from about 350° C. to about 900° C., whereas preferred temperatures may range from about 585° C. to about 675° C. Suitable durations may range from about 0.5 hour to about 3 hours, whereas preferred durations may range from about 1 hour to about 1.5 hours. Suitable pressures may range from about 1 mT to about 760 T, whereas preferred pressures may range from about 300 mT to about 600 mT.

A queue time of preferably about 2 hours between the anneal and the dielectric deposition preferably accompanies the use of the anneal. A ramp up duration may range from about 0.2 hours to about 1.2 hours and preferably is between about 0.5 hours and 0.8 hours. Similarly, a ramp down duration also may range from about 0.2 hours to about 1.2 hours and preferably is between about 0.5 hours and 0.8 hours.

Although not wanting to be bound by any particular theory, it is believed that CNT material may absorb water from the air over time. Likewise, it is believed that the moisture may increase the likelihood of de-lamination of the CNT material. In some cases, it also might be acceptable to have a que time of 2 hours from the time of CNT growth to dielectric deposition, skipping the anneal altogether.

Incorporation of such a post-CNT-formation-anneal preferably takes into account other layers present on the device that includes the CNT material, because these other layers will also be subject to the anneal. For example, the anneal may be omitted or its parameters may be adjusted where the aforementioned preferred anneal parameters would damage the other layers. The anneal parameters may be adjusted within ranges that result in the removal of moisture without damaging the layers of the annealed device. For instance, the temperature may be adjusted to stay within an overall thermal budget of a device being formed. Likewise, any suitable forming gases, temperatures and/or durations may be used that are appropriate for a particular device. In general, such an anneal may be used with any carbon-based layer or carbon-containing material, such as layers having CNT material, graphite, graphene, amorphous carbon, etc.

As will be described further below with reference to FIGS. 4A-F, following formation of CNT material 212/reversible resistance-switching element 202, dielectric material is deposited on top of and around CNT material 212 and first conductor 206. In some embodiments, the dielectric material may be deposited using CVD, high density plasma ("HDP") deposition, arc plasma assisted deposition, spin-coating deposition or the like. This dielectric material isolates CNT material 212 and first conductor 206 from other similar CNT material regions and first conductors of other memory cells (not shown) fabricated on a memory level that includes the memory cell 200. A CMP or dielectric etchback step then is performed to planarize the dielectric material and remove the dielectric material from the top of CNT material 212. Diode 204 is then formed over CNT material 212/reversible resistance-switching element 202.

As stated, diode 204 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, diode 204 may be formed from a polycrystalline semiconductor material such as polysilicon, a polycrystalline silicon-germanium alloy, polygermanium or any other suitable material. For example, diode 204 may include a heavily doped n+ polysilicon region 302, a lightly doped or an intrinsic (unintentionally doped) polysilicon region 304 above n+ polysilicon region 302 and a heavily doped, p+ polysilicon region 306 above intrinsic region 304. In some embodiments, a thin germanium and/or silicon-germanium alloy layer (not shown) may be formed on n+ polysilicon region 302 to prevent and/or reduce dopant migration from n+ polysilicon region 302 into intrinsic region 304. Use of such a layer is described, for example, in U.S. patent application Ser. No. 11/298,331, filed Dec. 9, 2005 and titled "Deposited Semiconductor Structure To Minimize N-Type Dopant Diffusion And Method Of Making" (the "'331 Application"), which is hereby incorporated by reference herein in its entirety for all purposes. In some embodiments, a few hundred angstroms or less of silicon-germanium alloy with about 10 at % or more of germanium may be employed. It will be understood that the locations of the n+ and p+ regions may be reversed.

In some embodiments, a barrier layer 308 such as titanium nitride, tantalum nitride, tungsten nitride, etc., may be formed between CNT material 212 and n+ region 302 (e.g., to prevent and/or reduce migration of metal atoms into the polysilicon regions).

Following formation of diode 204 and barrier layer 308, diode 204 and barrier layer 308 are etched to form a pillar structure (as shown). Dielectric material 309 is deposited on top of and around the pillar structure to isolate the pillar structure from other similar pillar structures of other memory cells (not shown) fabricated on a memory level that includes memory cell 200. A CMP or dielectric etchback step then is performed to planarize dielectric material 309 and remove the dielectric material from the top of diode 204.

When diode 204 is formed from deposited silicon (e.g., amorphous or polycrystalline), a silicide layer 310 may be formed on diode 204 to place the deposited silicon in a low resistivity state, as fabricated. Such a low resistivity state allows for easier programming of memory cell 200 as a large voltage is not required to switch the deposited silicon to a low resistivity state. For example, a silicide-forming metal layer 312 such as titanium or cobalt, may be deposited on p+ polysilicon region 306. During a subsequent anneal step (described below) employed to crystallize the deposited silicon that forms diode 204, silicide-forming metal layer 312 and the deposited silicon of diode 204 interact to form silicide layer 310, consuming all or a portion of silicide-forming metal layer 312.

As described in U.S. Pat. No. 7,176,064, "Memory Cell Comprising a Semiconductor Junction Diode Crystallized Adjacent to a Silicide," which is hereby incorporated by reference herein in its entirety, silicide-forming materials such as titanium and cobalt react with deposited silicon during annealing to form a silicide layer. The lattice spacings of titanium silicide and cobalt silicide are close to that of silicon, and it appears that such silicide layers may serve as "crystallization templates" or "seeds" for adjacent deposited silicon as the deposited silicon crystallizes (e.g., silicide layer 310 enhances the crystalline structure of silicon diode 204 during annealing). Lower resistivity silicon thereby is provided. Similar results may be achieved for silicon-germanium alloy and/or germanium diodes.

Following formation of silicide-forming metal layer 312, second conductor 208 is formed. In some embodiments, one or more barrier layers and/or adhesion layers 314 may be formed over silicide-forming metal layer 312 prior to deposition of a conductive layer 315. Conductive layer 315, barrier layer 314 and silicide-forming metal layer 312 may be patterned and/or etched together to form second conductor 208.

Following formation of second conductor 208, memory cell 200 may be annealed to crystallize the deposited semiconductor material of diode 204 (and/or to form silicide layer 310). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. As stated, silicide layer 310 may serve as a "crystallization template" or "seed" during annealing for underlying deposited semiconductor material that forms diode 204. Lower resistivity diode material thereby is provided.

Figure 3B:
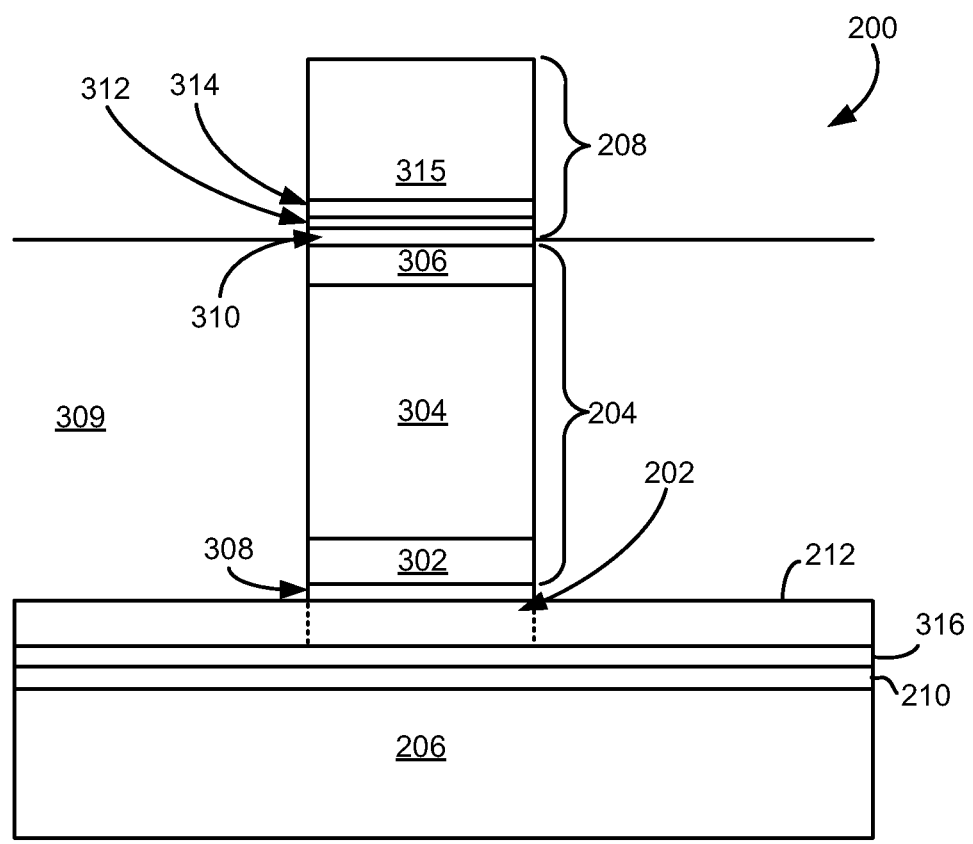
FIG. 3B is a cross-sectional view of a second exemplary embodiment of the memory cell of FIG. 2A.

In some embodiments, CNT seeding layer 210 may include one or more additional layers. For example, FIG. 3B is a cross-sectional view of a second exemplary embodiment of the memory cell 200 of FIG. 2A in which CNT seeding layer 210 includes an additional metal catalyst layer 316. Metal catalyst layer 316 may be selectively deposited over CNT seeding layer 210 after CNT seeding layer 210 has been patterned, etched and electrically isolated with dielectric material (as described above). For example, in some embodiments, a nickel, cobalt, iron, etc., metal catalyst layer 316 may be selectively formed over a surface roughened titanium or tantalum nitride CNT seeding layer 210 by electroless deposition, electroplating or the like. CNT material 212 then may be formed over the metal catalyst coated CNT seeding layer 210. In some embodiments, use of metal catalyst layer 316 may eliminate the need for a catalyst precursor during CNT formation. Exemplary metal catalyst layer thicknesses range from about 1 to 200 angstroms, although other thicknesses may be used. A nickel, cobalt, iron, or similar metal catalyst layer also may be formed over a non-surface-roughened or smooth titanium nitride, tanatalum nitride or similar layer by electroless deposition, electroplating or the like.

Figure 3C:
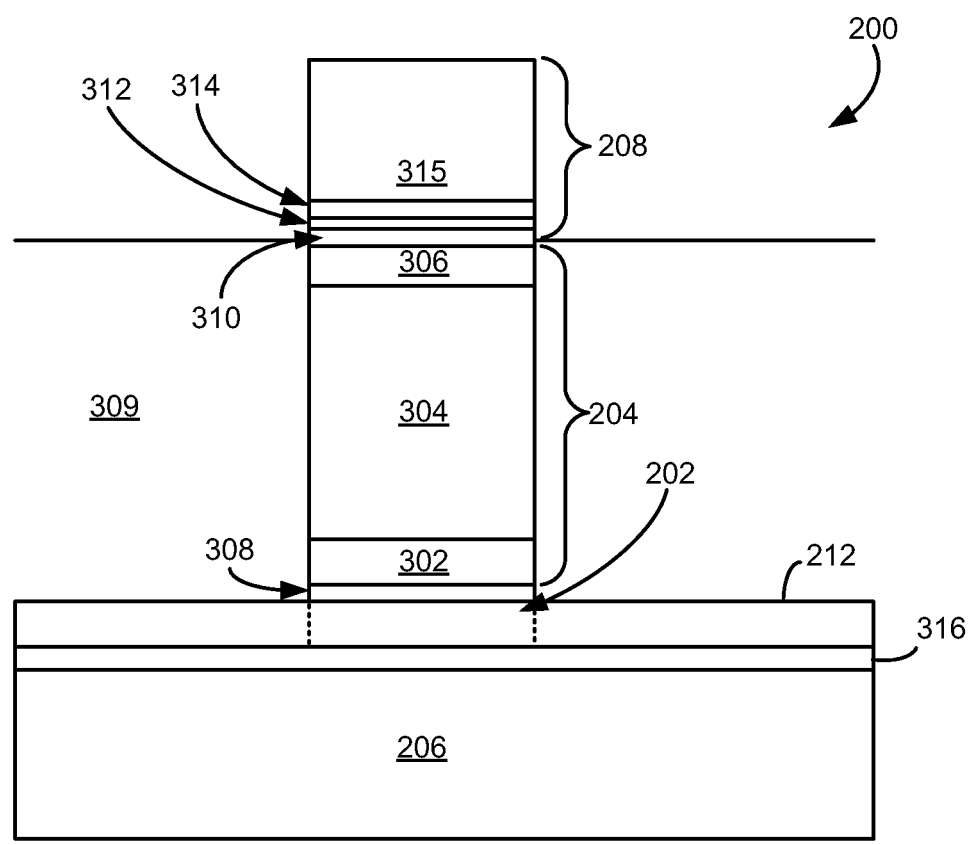
FIG. 3C is a cross-sectional view of a third exemplary embodiment of the memory cell of FIG. 2A.

In another embodiment, only metal catalyst layer 316 may be used for CNT seeding. For example, FIG. 3C is a cross-sectional view of a third exemplary embodiment of memory cell 200 of FIG. 2A. Memory cell 200 of FIG. 3C is similar to memory cell 200 of FIG. 3B, but does not include surface roughened CNT seeding layer 210. In the embodiment shown, no CNT seeding layer 210 is deposited over first conductor 206 prior to etching and patterning of first conductor 206. After first conductor 206 is patterned and etched, a metal catalyst layer 316 such as nickel, cobalt, iron, etc., may be selectively deposited on first conductor 206, and CNT material 212 may be formed over metal catalyst layer 316.

Exemplary Fabrication Process for a Memory Cell

FIGS. 4A-F illustrate cross sectional views of a portion of a substrate 400 during fabrication of a first memory level in accordance with the present invention. As will be described below, the first memory level includes a plurality of memory cells that each include a reversible resistance-switching element formed by selectively fabricating CNT material above a substrate. Additional memory levels may be fabricated above the first memory level (as described previously with reference to FIGS. 2C-2D).

With reference to FIG. 4A, substrate 400 is shown as having already undergone several processing steps. Substrate 400 may be any suitable substrate such as a silicon, germanium, silicon-germanium, undoped, doped, bulk, silicon-on-insulator or other substrate with or without additional circuitry. For example, substrate 400 may include one or more n-well or p-well regions (not shown).

Isolation layer 402 is formed above substrate 400. In some embodiments, isolation layer 402 may be a layer of silicon dioxide, silicon nitride, silicon oxynitride or any other suitable insulating layer.

Following formation of isolation layer 402, an adhesion layer 404 is formed over isolation layer 402 (e.g., by physical vapor deposition or another method). For example, adhesion layer 404 may be about 20 to about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. In some embodiments, adhesion layer 404 may be optional.

After formation of adhesion layer 404, a conductive layer 406 is deposited over adhesion layer 404. Conductive layer 406 may include any suitable conductive material such as tungsten or another appropriate metal, heavily doped semiconductor material, a conductive silicide, a conductive silicide-germanide, a conductive germanide, or the like deposited by any suitable method (e.g., chemical vapor deposition, physical vapor deposition, etc.). In at least one embodiment, conductive layer 406 may comprise about 200 to about 2500 angstroms of tungsten. Other conductive layer materials and/or thicknesses may be used.

After formation of conductive layer 406, a CNT seeding layer 407 is formed over the conductive layer 406. In some embodiments, CNT seeding layer 407 may be about 1000 to about 5000 angstroms of titanium or tantalum nitride, although other materials and/or thicknesses may be used. In such an embodiment, the surface of CNT seeding layer 407 may be roughened to allow CNTs to be formed directly on the seeding layer. For example, CNT seeding layer 407 may be roughened or otherwise textured by a CMP or etchback process. In one or more embodiments, CNT seeding layer 407 may be roughened to have an arithmetic average surface roughness Ra of at least about 850 to 4000 angstroms, and more preferably at least about 4000 angstroms. Other surface roughnesses may be employed.

In alternative embodiments, CNT seeding layer 407 may be about 1 to about 500 angstroms of Si/Ge, although other thicknesses may be used. The Si/Ge layer may be formed on conductive layer 406 by CVD, PECVD, or other similar processing techniques. Alternatively, a silicon seed layer may be formed over conductive layer 406, and germanium nano-islands may be selectively grown onto the silicon seed layer, such as by CVD. Selective germanium deposition may be performed using low pressure CVD techniques at approximately 500° C. and 100 mT with $GeH_4$. For either method, a carbon implant with dose of approximately $3\times10^{16}$ $cm^{-2}$ and energy of approximately 30 KeV may be used. Following implant, the surface may be treated with an approximately 30% $H_2O_2$ solution which results in a GeO or SiO growth of approximately 5 angstroms to approximately 19 angstroms.

Following formation of CNT seeding layer 407 and/or CNT seeding layer roughening, adhesion layer 404, conductive layer 406 and CNT seeding layer 407 are patterned and etched as shown in FIG. 4B. For example, adhesion layer 404, conductive layer 406 and CNT seeding layer 407 may be patterned and etched using conventional lithography techniques, with a soft or hard mask, and wet or dry etch processing. In at least one embodiment, adhesion layer 404, conductive layer 406 and CNT seeding layer 407 are patterned and etched to form substantially parallel, substantially co-planar first conductors 408 (as shown in FIG. 4B). Exemplary widths for first conductors 408 and/or spacings between first conductors 408 range from about 200 to about 2500 angstroms, although other conductor widths and/or spacings may be used.

Figure 4C:
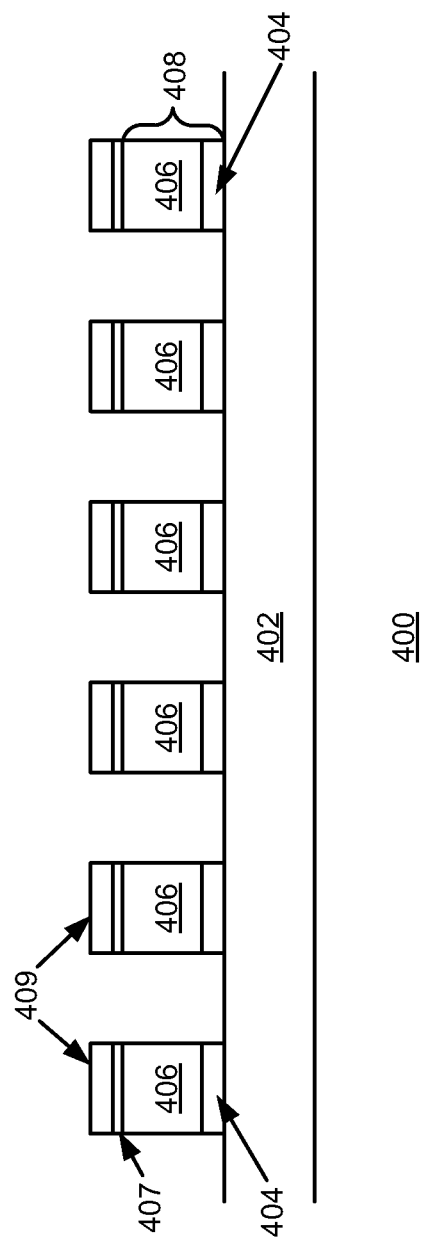

FIG. 4C illustrates an exemplary process for forming a CNT material 409 on a metallic CNT seeding layer 407. If CNT seeding layer 407 is titanium nitride, tantalum nitride or a similar material, the surface of CNT seeding layer 407 may be roughened to allow CNTs to be formed on the titanium nitride, tantalum nitride or similar CNT seeding layer 407 directly. See, e.g., Smith and the Rao Article, both referenced above).

In some embodiments, an additional metal catalyst layer (not shown) such as nickel, cobalt, iron, etc., may be selectively deposited over CNT seeding layer 407 prior to formation of CNT material 409 to provide the benefits of a metal catalyst during CNT formation (as described previously with reference to FIG. 3B). In other embodiments, a metal catalyst layer may be used without an underlying, surface roughened seeding layer (as described previously with reference to FIG. 3C).

In either case, a CNT fabrication process is performed to selectively grow and/or deposit CNT material 409 on each conductor 408. For each memory cell, at least a portion of CNT material 409 formed on the memory cell's respective first conductor 408 serves as the reversible resistance-switching element 202 of the memory cell. Any suitable method may be used to form CNT material 409 on each first conductor 408. For example, CVD, plasma-enhanced CVD, laser vaporization, electric arc discharge or the like may be employed.

In one exemplary embodiment, CNTs may be formed on a TiN seeding layer by CVD at a temperature of about 675 to 700° C. in xylene, argon, hydrogen and/or ferrocene at a flow rate of about 100 sccm for about 30 minutes. Other temperatures, gases, flow rates and/or growth times may be used.

In another exemplary embodiment, CNTs may be formed on a nickel catalyst layer by CVD at a temperature of about 650° C. in about 20% $C_2H_4$ and 80% argon at a pressure of about 5.5 Torr for about 20 minutes. Other temperatures, gases, ratios, pressures and/or growth times may be used.

In yet another embodiment, CNTs may be formed on a metal catalyst layer such as nickel, cobalt, iron, etc., using plasma enhanced CVD at a temperature of about 600 to 900° C. in about 20% methane, ethylene, acetylene or another hydrocarbon diluted with about 80% argon, hydrogen and/or ammonia using an RF power of about 100-200 Watts for about 8-30 minutes. Other temperatures, gases, ratios, powers and/or growth times may be used.

Figure 4D:
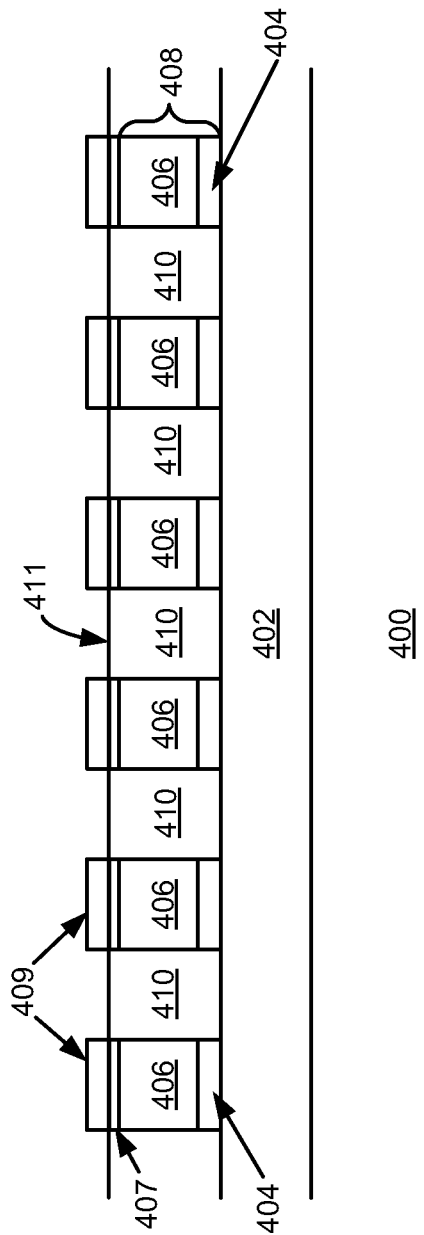

FIG. 4D illustrates an alternative exemplary process for forming CNT material 409 on a Si/Ge CNT seeding layer 407. In particular, after Si/Ge CNT seeding layer 407 and first conductor 408 have been patterned and etched, a dielectric 410 may be deposited to fill between the structures. In some embodiments, dielectric layer 410 may be deposited using CVD, HDP deposition, arc plasma assisted deposition, spin-coating deposition or the like. For example, approximately a micron or more of silicon dioxide may be deposited on substrate 400 and planarized using chemical mechanical polishing or an etchback process to form a planar surface 411. Planar surface 411 includes exposed, discrete regions of Si/Ge CNT seeding layer 407 separated by dielectric material 410, as shown. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

Following planarization, Si/Ge CNT seeding layer 407 may be approximately 50 nm thick with an approximately 70% Si and approximately 30% Ge composition. Alternatively, an Si seed layer may be used and Ge nano-islands may be selectively grown onto the Si. Some processing conditions for selective Ge deposition include LPCVD techniques at approximately 500° C. and 100 mT with $GeH_4$. With either seed method, a carbon implant with dose of approximately $3\times10^{16}$ $cm^{-2}$ and energy of approximately 30 KeV may be used. Post implant, the surface may be treated with an approximately 30% $H_2O_2$ solution which results in a GeO or SiO growth of approximately 5 angstroms to approximately 19 angstroms.

As stated, CNT material 409 forms only over CNT seeding layer 407 formed on each conductor 408. In some embodiments, CNT material 409 may have a thickness of about 1 nanometer to about 1 micron (and even tens of microns), and more preferably about 10 to about 20 nanometers, although other CNT material thicknesses may be used. The density of individual tubes in CNT material 409 may be, for example, about $6.6\times10^3$ to about $1\times10^6$ $CNTs/micron^2$, and more preferably at least about $6.6 \times 10^4$ CNTs/micron$^2$, although other densities may be used. For example, assuming that first conductors 408 have a width of about 45 nanometers, in some embodiments, it is preferred to have at least about 10 CNTs, and more preferably at least about 100 CNTs, in CNT material 409 formed above each first conductor 408 (although fewer CNTs, such as 1, 2, 3, 4, 5, etc., or more CNTs, such as more than 100, may be employed).

After CNT material 409 has been formed over each first conductor 408, a dielectric layer 410 (FIG. 4E) is deposited over substrate 400 to fill the voids between the CNT material regions and first conductors 408. In some embodiments, dielectric layer 410 may be deposited using CVD, HDP deposition, arc plasma assisted deposition, spin-coating deposition or the like. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like. If the CNTs are exposed to air for lengthy amounts of time a dehydration anneal might be needed to improve the dielectric adherence. For example, approximately a micron or more of silicon dioxide may be deposited on substrate 400 and planarized using chemical mechanical polishing or an etchback process to form a planar surface 412. Planar surface 412 includes exposed, discrete regions of CNT material 409 separated by dielectric material 410, as shown.

Figure 4E:
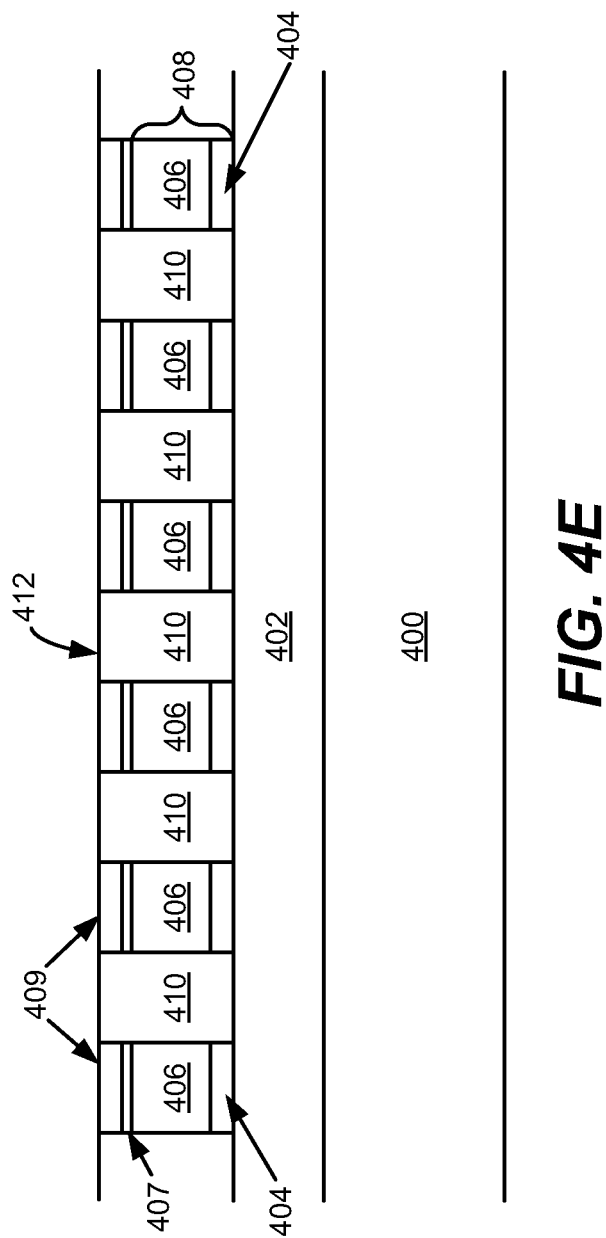
Figure 4F:
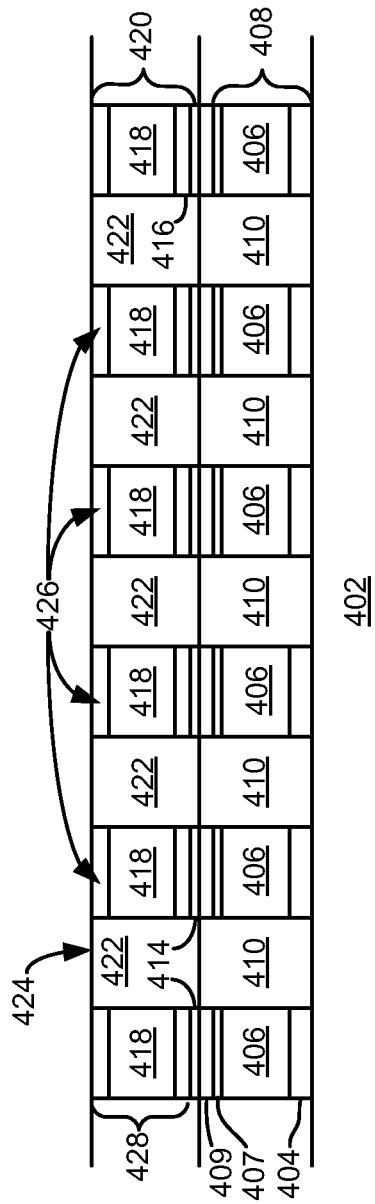

With reference to FIG. 4F, after planarization and exposure of the top surface of the CNT material regions, the diode structures of each memory cell are formed. In some embodiments, a barrier layer 414, such as titanium nitride, tantalum nitride, tungsten nitride, etc., may be formed over CNT material regions 409 prior to diode formation (e.g., to prevent and/or reduce migration of metal atoms into the polysilicon regions). Barrier layer 414 may be about 20 to about 500 angstroms, and preferably about 100 angstroms, of titanium nitride or another suitable barrier layer such as tantalum nitride, tungsten nitride, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 414, deposition of the semiconductor material used to form the diode of each memory cell begins (e.g., diode 204 in FIGS. 2A-3C). Each diode may be a vertical p-n or p-i-n diode as previously described. In some embodiments, each diode is formed from a polycrystalline semiconductor material such as polysilicon, a polysilicon-germanium alloy, germanium or any other suitable material. For convenience, formation of a polysilicon, downward-pointing diode is described herein. It will be understood that other materials and/or diode configurations may be used.

With reference to FIG. 4F, following formation of barrier layer 414, a heavily doped n+ silicon layer 416 is deposited on barrier layer 414. In some embodiments, n+ silicon layer 416 is in an amorphous state as deposited. In other embodiments, n+ silicon layer 416 is in a polycrystalline state as deposited. CVD or another suitable process may be employed to deposit n+ silicon layer 416. In at least one embodiment, n+ silicon layer 416 may be formed, for example, from about 100 to about 1000 angstroms, preferably about 100 angstroms, of phosphorus or arsenic doped silicon having a doping concentration of about $10^{21}$ cm$^{-3}$. Other layer thicknesses, dopants and/or doping concentrations may be used. N+ silicon layer 416 may be doped in situ, for example, by flowing a donor gas during deposition. Other doping methods may be used (e.g., implantation).

After deposition of n+ silicon layer 416, a lightly doped, intrinsic and/or unintentionally doped silicon layer 418 is formed over n+ silicon layer 416. In some embodiments, intrinsic silicon layer 418 is in an amorphous state as deposited. In other embodiments, intrinsic silicon layer 418 is in a polycrystalline state as deposited. Chemical vapor deposition or another suitable deposition method may be employed to deposit intrinsic silicon layer 418. In at least one embodiment, intrinsic silicon layer 418 may be about 500 to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on n+ silicon layer 416 prior to deposition of intrinsic silicon layer 418 to prevent and/or reduce dopant migration from n+ silicon layer 416 into intrinsic silicon layer 418 (as described in the '331 Application, previously incorporated).

Following formation of n+ silicon layer 416 and intrinsic silicon layer 418, n+ silicon layer 416, intrinsic silicon layer 418, and barrier layer 414 are patterned and etched to form silicon pillars 420 overlying first conductors 408 (as shown). Conventional lithography techniques, with a soft or hard mask, and wet or dry etch processing may be employed to form silicon pillars 420.

After silicon pillars 420 have been formed, a dielectric layer 422 is deposited to fill the voids between silicon pillars 420. For example, approximately 200-7000 angstroms of silicon dioxide may be deposited and planarized using chemical mechanical polishing or an etchback process to form a planar surface 424. Planar surface 424 includes exposed top surfaces of silicon pillars 420 separated by dielectric material 422, as shown. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

After formation of silicon pillars 420, a p+ silicon region 426 is formed within each silicon pillar 420, near the upper surface of silicon pillars 420. For example, a blanket p+ implant may be employed to implant boron a predetermined depth within silicon pillars 420. Exemplary implantable molecular ions include $BF_2$, $BF_3$, B and the like. In some embodiments, an implant dose of about $1-5 \times 10^{15}$ ions/cm$^2$ may be employed. Other implant species and/or doses may be used. Further, in some embodiments, a diffusion process may be employed to dope the upper portion of silicon pillars 420. In at least one embodiment, p+ silicon regions 426 have a depth of about 100-700 angstroms, although other p+ silicon region sizes may be used. (Note that if the diodes to be formed are upward pointing p-n or p-i-n diodes, the upper portion of silicon pillars 420 will be doped n-type). Each silicon pillar 420 thereby includes a downward-pointing, p-i-n diode 428.

Figure 4G:
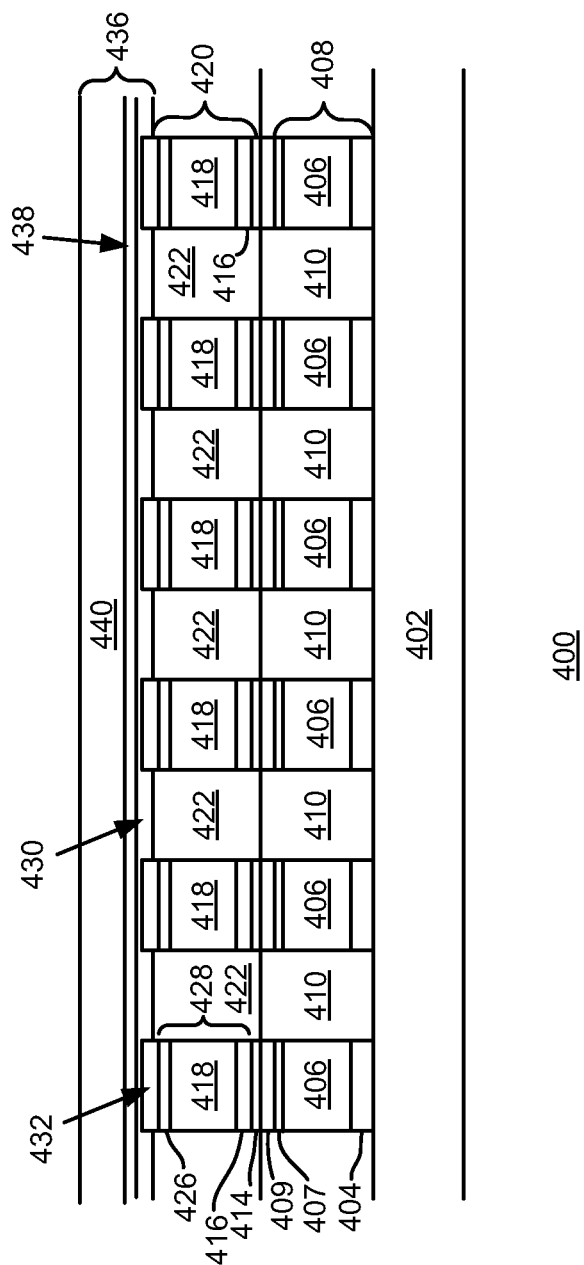

With reference to FIG. 4G, after completion of p-i-n diodes 428, a silicide-forming metal layer 430 is deposited over substrate 400. Exemplary silicide-forming metals include sputter or otherwise deposited titanium or cobalt. In some embodiments, silicide-forming metal layer 430 has a thickness of about 10 to about 200 angstroms, preferably about 20 to about 50 angstroms and more preferably about 20 angstroms. Other silicide-forming metal layer materials and/or thicknesses may be used. As will be described further below, annealing of the structure causes metal from silicide-forming metal layer 430 and silicon from p+ silicon regions 426 to react to form a silicide region 432 adjacent each p+ silicon region 426.

Following formation of silicide-forming metal layer 430, second conductors 436 may be formed above diodes 428 in a manner similar to the formation of first conductors 408. In some embodiments, one or more barrier layers and/or adhesion layers 438 may be placed over silicide-forming metal layer 430 prior to deposition of a conductive layer 440 used to form second conductors 436.

The conductive layer 440 may be formed from any suitable conductive material such as tungsten, another suitable metal, heavily doped semiconductor material, a conductive silicide, a conductive silicide-germanide, a conductive germanide, or the like deposited by any suitable method (e.g., chemical vapor deposition, physical vapor deposition, etc.). Other conductive layer materials may be used. Barrier layers and/or adhesion layers 438 may include titanium nitride or another suitable layer such as tantalum nitride, tungsten nitride, combinations of one or more layers, or any other suitable material (s). The deposited conductive layer 440, barrier and/or adhesion layer 438, and/or silicide-forming metal layer 430 may be patterned and etched to form second conductors 436. In at least one embodiment, second conductors 436 are substantially parallel, substantially coplanar conductors that extend in a different direction than first conductors 408.

In other embodiments of the invention, second conductors 436 may be formed using a damascene process in which a dielectric layer is formed, patterned and etched to create openings or voids for second conductors 436. The openings or voids may be filled with adhesion layer 438 and conductive layer 440 (and/or a conductive seed, conductive fill and/or barrier layer if needed). Adhesion layer 438 and conductive layer 440 then may be planarized to form a planar surface.

In at least one embodiment of the invention, a hard mask may be formed over diodes 428 as described, for example, in U.S. patent application Ser. No. 11/444,936, filed May 13, 2006 and titled "Conductive Hard Mask To Protect Patterned Features During Trench Etch" (the "'936 Application") which is hereby incorporated by reference herein in its entirety for all purposes. For example, prior to patterning and etching of intrinsic silicon layer 418 and n+ silicon layer 416, a p+ silicon layer may be formed by doping intrinsic layer 418 (e.g., using ion implantation or another doping method). Silicide-forming metal layer 430 may be formed over p+ silicon layer, followed by a barrier layer and/or conductive layer. These barrier and conductive layers may serve as a hard mask during patterning and etching of diodes 428 and may mitigate any overetching that may occur during formation of second conductors 436 (as described in the '936 Application).

Following formation of second conductors 436, the structure may be annealed to crystallize the deposited semiconductor material of diodes 428 (and/or to form silicide regions 432). In at least one embodiment, the anneal may be performed for about 10 seconds to about 2 minutes in nitrogen at a temperature of about 600 to 800° C., and more preferably between about 650 and 750° C. Other annealing times, temperatures and/or environments may be used. Silicide regions 432 may serve as "crystallization templates" or "seeds" during annealing for underlying deposited semiconductor material that forms diodes 428 (e.g., changing any amorphous semiconductor material to polycrystalline semiconductor material and/or improving overall crystalline properties of the diodes 428). Lower resistivity diode material thereby is provided.

Alternative Exemplary Memory Cell

Figure 5B:
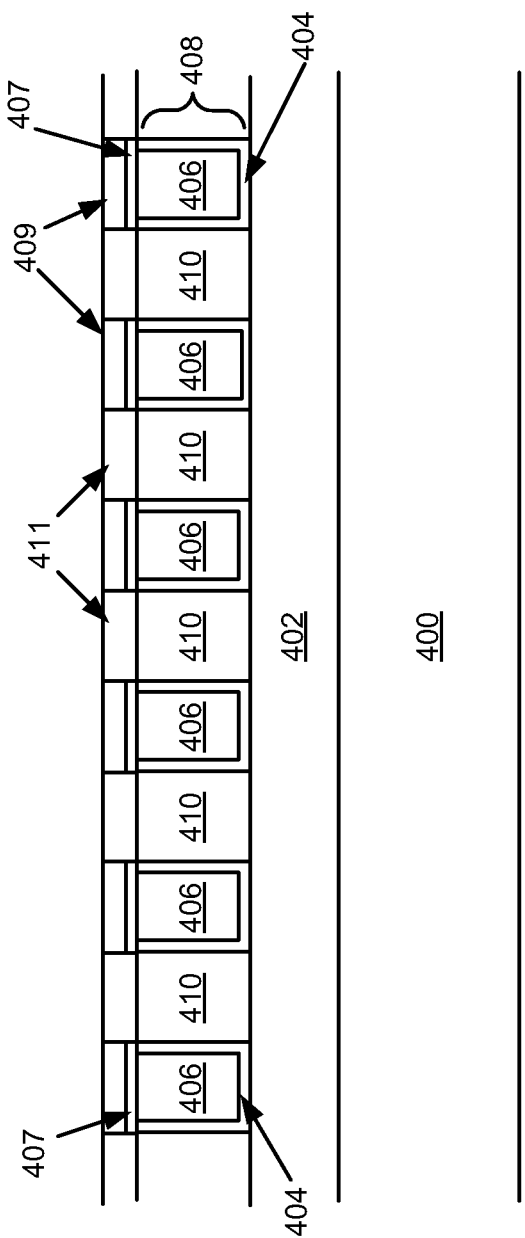
Figure 5C:
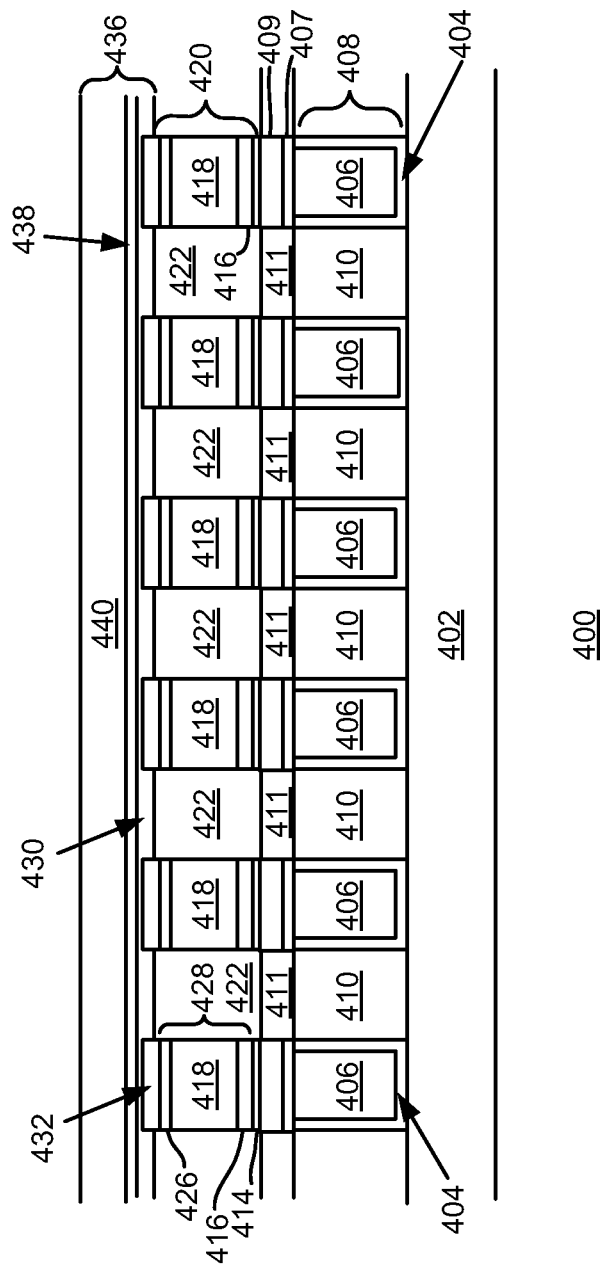

In other embodiments of the invention, first conductors 408 may be formed using a damascene process as described below with reference to FIGS. 5A-C. Referring to FIG. 5A, dielectric layer 410 is formed, patterned and etched to create openings or voids for first conductors 408. The openings or voids then may be filled with adhesion layer 404 and conductive layer 406 (and/or a conductive seed, conductive fill and/or barrier layer if needed). Adhesion layer 404 and conductive layer 406 then may be planarized to form a planar surface (as shown). In such an embodiment, adhesion layer 404 lines the bottom and sidewalls of each opening or void.

Following planarization, CNT seeding layer 407 is formed over first conductors 408. In at least one embodiment, a selective deposition process may be used to form a metal catalyst CNT seeding layer 407 over each first conductor 408. Exemplary metal catalyst seeding layers include nickel, cobalt, iron, etc., which may be selectively deposited by electroless deposition, electroplating or the like. Alternatively, a titanium nitride, tantalum nitride or similar CNT seeding layer may be deposited over first conductors 408, surface roughened, patterned and etched to form a CNT seeding layer region 407 over each first conductor 408 (with or without an additional metal catalyst layer such as nickel, cobalt, iron, etc.). A nickel, cobalt, iron, or similar metal catalyst layer also may be formed over a non-surface-roughened or smooth titanium nitride, tanatalum nitride or similar layer by electroless deposition, electroplating or the like. Alternatively, a Si/Ge CNT seeding layer may be deposited over first conductors 408, patterned and etched to form a CNT seeding layer region 407 over each first conductor 408.

Referring to FIG. 5B, following formation of CNT seeding layer regions 407, CNT material 409 is selectively formed over each CNT seeding layer region. Any suitable method may be used to form CNT material 409 over each conductor 408. For example, CVD, plasma-enhanced CVD, laser vaporization, electric arc discharge or the like may be employed.

Vertically aligned CNTs allow vertical current flow with little or no lateral conduction. To reduce or prevent the formation of lateral or bridging conduction paths between adjacent memory cells, in some embodiments, the individual tubes of CNT material 409 may be fabricated to be substantially vertically aligned (e.g., thereby reducing and/or preventing the state of a memory cell from being influenced or "disturbed" by the state and/or programming of adjacent memory cells). Note that individual tube isolation may or may not extend over the entire thickness of CNT material 409. For example, during the initial growth phase, some or most of the individual tubes may be vertical aligned (e.g., not touching). However, as the individual tubes increase in length vertically, portions of the tubes may come in contact with one another, and even become entangled or entwined.

Following formation of CNT material 409 over each first conductor 408, dielectric material 411 is deposited on top of and around the regions of CNT material 409 to isolate adjacent CNT material regions from one another. In some embodiments, dielectric material 411 may be deposited using CVD, HDP deposition, arc plasma assisted deposition, spin-coating deposition or the like. A CMP or dielectric etchback step then is performed to planarize dielectric material 411 and remove the dielectric material from the top of the CNT material regions. For example, approximately 200-7000 angstroms, and in some embodiments a micron or more, of silicon dioxide may be deposited and planarized using chemical mechanical polishing or an etchback process. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

Once the dielectric layer has been planarized and the top surface of the CNT material regions exposed, formation of the memory level proceeds as previously described with reference to FIGS. 4E-4G, resulting in the memory level shown in FIG. 5C.

The foregoing description discloses only exemplary embodiments of the invention. Modifications of the above disclosed apparatus and methods which fall within the scope of the invention will be readily apparent to those of ordinary skill in the art. For example, methods in accordance with this invention may be used to selectively grow vertically oriented CNT films in series with a thin film transistor ("TFT") as the steering element instead of the vertical pillar diode. The TFT steering element may be either planar or vertical.

Accordingly, although the present invention has been disclosed in connection with exemplary embodiments thereof, it should be understood that other embodiments may fall within the spirit and scope of the invention, as defined by the following claims.

The invention claimed is:

1. A memory cell comprising:
   a first conductor;
   a silicon-germanium layer above the first conductor;
   a reversible resistance-switching element including resistance-switching carbon nano-tube ("CNT") material selectively fabricated on the silicon-germanium layer;
   a diode formed above the reversible resistance-switching element; and
   a second conductor formed above the diode.

2. The memory cell of claim 1, wherein the CNT material includes CNTs that are substantially vertically aligned to reduce lateral conduction in the CNT material.

3. The memory cell of claim 1, wherein the CNT material includes defects that tune the switching characteristics of the CNT material.

4. The memory cell of claim 1, wherein the diode comprises a vertical polycrystalline diode.

5. The memory cell of claim 1, further comprising a silicide, silicide-germanide or germanide region in contact with polycrystalline material of the vertical polycrystalline diode so that the polycrystalline material is in a low-resistivity state.

6. A plurality of nonvolatile memory cells comprising:
   a first plurality of substantially parallel, substantially coplanar conductors extending in a first direction;
   a plurality of diodes;
   a plurality of reversible resistance-switching elements, each reversible resistance-switching element comprising:
      a silicon-germanium layer fabricated above one of first conductors; and
      a resistance-switching carbon nano-tube ("CNT") material layer selectively fabricated on the silicon-germanium layer; and
   a second plurality of substantially parallel, substantially coplanar conductors extending in a second direction different from the first direction; and
   wherein, in each memory cell, one of the diodes is formed above one of the reversible resistance-switching elements, disposed between one of the first conductors and one of the second conductors.

7. The plurality of memory cells of claim 6, wherein the CNT material layer includes CNTs that are substantially vertically aligned so as to reduce lateral conduction in the CNT material.

8. The plurality of memory cells of claim 6, wherein the CNT material layer extends between two or more of the memory cells and forms the reversible resistance-switching element of the two or more memory cells.

9. The plurality of memory cells of claim 6, wherein each diode is a vertical polycrystalline diode.

10. The plurality of memory cells of claim 6, further comprising silicide, silicide-germanide or germanide in contact with polycrystalline material of each vertical polycrystalline diode so that the polycrystalline material is in a low-resistivity state.

11. A monolithic three dimensional memory array comprising:
    a first memory level formed above a substrate, the first memory level comprising:
    a plurality of memory cells, wherein each memory cell of the first memory level comprises:
       a first conductor;
       a reversible resistance-switching element including a silicon-germanium layer fabricated above the first conductor, and a resistance-switching carbon nano-tube ("CNT") material layer selectively fabricated on the silicon-germanium layer; and
       a diode formed above the reversible resistance-switching element; and
    a second conductor formed above the diode; and
    at least a second memory level monolithically formed above the first memory level.

12. The monolithic three dimensional memory array of claim 11, wherein the CNT material layer of each reversible resistance-switching element includes CNTs that are substantially vertically aligned so as to reduce lateral conduction in the CNT material.

13. The monolithic three dimensional memory array of claim 11, wherein the CNT material layer extends between two or more of the memory cells and forms the reversible resistance-switching element of the two or more memory cells.

14. The monolithic three dimensional memory array of claim 11, wherein each diode comprises a vertical polycrystalline diode.

15. The monolithic three dimensional memory array of claim 14, wherein each vertical polycrystalline diode comprises a vertical polysilicon diode.

* * * * *